(12) United States Patent
Droopad

(10) Patent No.: US 6,673,646 B2
(45) Date of Patent: Jan. 6, 2004

(54) GROWTH OF COMPOUND SEMICONDUCTOR STRUCTURES ON PATTERNED OXIDE FILMS AND PROCESS FOR FABRICATING SAME

(75) Inventor: Ravindranath Droopad, Chandler, AZ (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/795,784

(22) Filed: Feb. 28, 2001

(65) Prior Publication Data

US 2002/0117664 A1 Aug. 29, 2002

(51) Int. Cl.$^7$ .............................................. H01L 21/00
(52) U.S. Cl. ........................ 438/85; 438/269; 438/341; 438/413
(58) Field of Search ........................ 438/85, 100, 269; 257/9, 35, 295

(56) References Cited

U.S. PATENT DOCUMENTS

| | | |
|---|---|---|
| 3,670,213 A | 6/1972 | Nakawaga et al. |
| 3,766,370 A | 10/1973 | Walther |
| 3,802,967 A | 4/1974 | Landany et al. ............ 148/171 |
| 3,914,137 A | 10/1975 | Huffman et al. |
| 3,935,031 A | 1/1976 | Adler |
| 4,006,989 A | 2/1977 | Andringa |
| 4,084,130 A | 4/1978 | Holton |
| 4,120,588 A | 10/1978 | Chaum |
| 4,146,297 A | 3/1979 | Alferness et al. |
| 4,174,422 A | 11/1979 | Matthews et al. |
| 4,242,595 A | 12/1980 | Lehovec |
| 4,284,329 A | 8/1981 | Smith et al. |
| 4,289,920 A | 9/1981 | Hovel |
| 4,297,656 A | 10/1981 | Pan |
| 4,392,297 A | 7/1983 | Little |
| 4,398,342 A | 8/1983 | Pitt et al. |
| 4,404,265 A | 9/1983 | Manasevit .................. 428/689 |
| 4,424,589 A | 1/1984 | Thomas et al. |
| 4,439,014 A | 3/1984 | Stacy et al. |

(List continued on next page.)

FOREIGN PATENT DOCUMENTS

| | | |
|---|---|---|
| EP | 0 250 171 | 12/1987 |
| EP | 0 300 499 | 1/1989 |
| EP | 0 309 270 | 3/1989 |

(List continued on next page.)

OTHER PUBLICATIONS

Wu et al, "Highly Oriented (Pb,La)(Zr, Ti)O3 thin films on Amorphous Substrates", IEEE, 1992, pp. 301–304.*

Glassman et al, "Evidence For Cooperative Oxidation of MOCVD Precursers used in BaSr1—xTiO3 Film Growth", Material Research Symposium Proceeding, 1997, pp. 321–326.*

"Integration of GaAs on Si using a spinel buffer layer, IBM Technical Bulletin," vol. 30, No. 6, Nov. 1987, p. 365.

(List continued on next page.)

Primary Examiner—William David Coleman
(74) Attorney, Agent, or Firm—Oblon, Spivak, McClelland, Maier & Neustadt, P.C.

(57) ABSTRACT

Compound semiconductor structures and devices can be grown on patterned oxide layers deposited on silicon. The deposition of Group II–VI and Group II–V compound semiconductors on patterned wafers results in an increase in the critical thickness for lattice mismatched layers and the relief of strain energy through side walls. As a result, high crystalline quality compound semiconductor material can be grown on less expensive and more accessible substrate to more cost effectively produce semiconductor components and devices having enhanced reliability.

18 Claims, 5 Drawing Sheets

U.S. PATENT DOCUMENTS

| | | | |
|---|---|---|---|
| 4,442,590 A | 4/1984 | Stockton et al. | |
| 4,452,720 A | 6/1984 | Harada et al. | |
| 4,459,325 A | 7/1984 | Nozawa et al. | |
| 4,482,422 A | 11/1984 | McGinn et al. | |
| 4,482,906 A | 11/1984 | Hovel et al. | 357/16 |
| 4,484,332 A | 11/1984 | Hawrylo | |
| 4,503,540 A | 3/1985 | Nakashima et al. | |
| 4,523,211 A | 6/1985 | Morimoto et al. | 357/4 |
| 4,594,000 A | 6/1986 | Falk et al. | |
| 4,629,821 A | 12/1986 | Bronstein-Bonte et al. | |
| 4,661,176 A | 4/1987 | Manasevit | 148/175 |
| 4,667,088 A | 5/1987 | Kramer | |
| 4,667,212 A | 5/1987 | Nakamura | |
| 4,681,982 A | 7/1987 | Yoshida | |
| 4,748,485 A | 5/1988 | Vasudev | |
| 4,756,007 A | 7/1988 | Qureshi et al. | |
| 4,772,929 A | 9/1988 | Manchester et al. | |
| 4,773,063 A | 9/1988 | Hunsperger et al. | |
| 4,774,205 A | 9/1988 | Choi et al. | |
| 4,777,613 A | 10/1988 | Shahan et al. | |
| 4,793,872 A | 12/1988 | Meunier et al. | |
| 4,802,182 A | 1/1989 | Thornton et al. | |
| 4,815,084 A | 3/1989 | Scifres et al. | |
| 4,841,775 A | 6/1989 | Ikeda et al. | |
| 4,845,044 A | 7/1989 | Ariyoshi et al. | |
| 4,846,926 A | 7/1989 | Kay et al. | 156/612 |
| 4,855,249 A | 8/1989 | Akasaki et al. | |
| 4,868,376 A | 9/1989 | Lessin et al. | |
| 4,872,046 A | 10/1989 | Morkoc et al. | |
| 4,876,208 A | 10/1989 | Gustafson et al. | |
| 4,876,219 A | 10/1989 | Eshita et al. | |
| 4,882,300 A | 11/1989 | Inoue et al. | 437/236 |
| 4,885,376 A | 12/1989 | Verkade | |
| 4,888,202 A | 12/1989 | Murakami et al. | |
| 4,889,402 A | 12/1989 | Reinhart | |
| 4,891,091 A | 1/1990 | Shastry | 156/606 |
| 4,896,194 A | 1/1990 | Suzuki | |
| 4,901,133 A | 2/1990 | Curran et al. | |
| 4,910,164 A | 3/1990 | Shichijo | |
| 4,912,087 A | 3/1990 | Aslam et al. | 505/1 |
| 4,928,154 A | 5/1990 | Umeno et al. | 357/16 |
| 4,934,777 A | 6/1990 | Jou et al. | |
| 4,952,420 A | 8/1990 | Walters | |
| 4,959,702 A | 9/1990 | Moyer et al. | |
| 4,963,508 A | 10/1990 | Umeno et al. | |
| 4,963,949 A | 10/1990 | Wanlass et al. | 357/16 |
| 4,965,649 A | 10/1990 | Zanio et al. | |
| 4,981,714 A | 1/1991 | Ohno et al. | |
| 4,984,043 A | 1/1991 | Vinal | |
| 4,999,842 A | 3/1991 | Huang et al. | 372/45 |
| 5,018,816 A | 5/1991 | Murray et al. | |
| 5,028,976 A | 7/1991 | Ozaki et al. | |
| 5,051,790 A | 9/1991 | Hammer | |
| 5,053,835 A | 10/1991 | Horikawa et al. | |
| 5,055,445 A | 10/1991 | Belt et al. | |
| 5,055,835 A | 10/1991 | Sutton | |
| 5,060,031 A | 10/1991 | Abrokwah et al. | |
| 5,063,081 A | 11/1991 | Cozzette et al. | |
| 5,063,166 A | 11/1991 | Mooney et al. | |
| 5,067,809 A | 11/1991 | Tsubota | |
| 5,073,981 A | 12/1991 | Giles et al. | |
| 5,075,743 A | 12/1991 | Behfar-Rad | |
| 5,081,062 A | 1/1992 | Vasudev et al. | |
| 5,081,519 A | 1/1992 | Nishimura et al. | |
| 5,103,494 A | 4/1992 | Mozer | |
| 5,116,461 A | 5/1992 | Lebby et al. | |
| 5,119,448 A | 6/1992 | Schaefer et al. | |
| 5,122,852 A | 6/1992 | Chang et al. | |
| 5,127,067 A | 6/1992 | Delcoco et al. | |
| 5,130,762 A | 7/1992 | Kulick | |
| 5,132,648 A | 7/1992 | Trinh et al. | |
| 5,140,651 A | 8/1992 | Soref et al. | |
| 5,141,894 A | 8/1992 | Bisaro et al. | 437/132 |
| 5,143,854 A | 9/1992 | Pirrung et al. | |
| 5,144,409 A | 9/1992 | Ma | |
| 5,155,658 A | 10/1992 | Inam et al. | 361/321 |
| 5,159,413 A | 10/1992 | Calviello et al. | 505/1 |
| 5,163,118 A | 11/1992 | Lorenzo et al. | |
| 5,173,474 A | 12/1992 | Connell et al. | 505/1 |
| 5,173,835 A | 12/1992 | Cornett et al. | |
| 5,181,085 A | 1/1993 | Moon et al. | |
| 5,185,589 A | 2/1993 | Krishnaswamy et al. | |
| 5,191,625 A | 3/1993 | Gustavsson | |
| 5,194,397 A | 3/1993 | Cook et al. | |
| 5,194,917 A | 3/1993 | Regener | |
| 5,198,269 A | 3/1993 | Swartz et al. | |
| 5,208,182 A | 5/1993 | Narayan et al. | |
| 5,210,763 A | 5/1993 | Lewis et al. | |
| 5,216,729 A | 6/1993 | Berger et al. | |
| 5,221,367 A | 6/1993 | Chisholm et al. | 148/33 |
| 5,225,031 A | 7/1993 | McKee et al. | 156/612 |
| 5,227,196 A | 7/1993 | Itoh | |
| 5,244,818 A | 9/1993 | Jokers et al. | |
| 5,248,564 A | 9/1993 | Ramesh | 428/688 |
| 5,260,394 A | 11/1993 | Tazaki et al. | |
| 5,266,355 A * | 11/1993 | Wernberg et al. | 427/109 |
| 5,270,298 A | 12/1993 | Ramesh | 505/1 |
| 5,280,013 A | 1/1994 | Newman et al. | |
| 5,281,834 A | 1/1994 | Cambou et al. | |
| 5,283,462 A | 2/1994 | Stengel | |
| 5,286,985 A | 2/1994 | Taddiken | |
| 5,293,050 A | 3/1994 | Chapple-Sokol et al. | |
| 5,306,649 A * | 4/1994 | Hebert | 148/DIG. 11 |
| 5,310,707 A | 5/1994 | Oishi et al. | 501/126 |
| 5,312,765 A | 5/1994 | Kanber | |
| 5,314,547 A | 5/1994 | Heremans et al. | |
| 5,323,023 A | 6/1994 | Fork | |
| 5,326,721 A | 7/1994 | Summerfelt | 437/131 |
| 5,334,556 A | 8/1994 | Guldi | |
| 5,352,926 A | 10/1994 | Andrews | |
| 5,356,509 A | 10/1994 | Terranova et al. | |
| 5,356,831 A | 10/1994 | Calviello et al. | |
| 5,357,122 A | 10/1994 | Okubora et al. | |
| 5,358,925 A | 10/1994 | Neville Connell et al. | 505/235 |
| 5,371,734 A | 12/1994 | Fischer | |
| 5,372,992 A | 12/1994 | Itozaki et al. | |
| 5,373,166 A | 12/1994 | Buchan et al. | |
| 5,391,515 A | 2/1995 | Kao et al. | |
| 5,393,352 A | 2/1995 | Summerfelt | 148/33.3 |
| 5,394,489 A | 2/1995 | Koch | |
| 5,395,663 A | 3/1995 | Tabata et al. | |
| 5,397,428 A | 3/1995 | Stoner et al. | |
| 5,399,898 A | 3/1995 | Rostoker | |
| 5,404,581 A | 4/1995 | Honjo | |
| 5,405,802 A | 4/1995 | Yamagata et al. | |
| 5,406,202 A | 4/1995 | Mehrgardt et al. | |
| 5,418,216 A | 5/1995 | Fork | 505/473 |
| 5,418,389 A | 5/1995 | Watanabe | 257/295 |
| 5,420,102 A | 5/1995 | Harshavardhan et al. | |
| 5,427,988 A | 6/1995 | Sengupta et al. | |
| 5,436,759 A | 7/1995 | Dijaili et al. | |
| 5,438,584 A | 8/1995 | Paoli et al. | |
| 5,441,577 A | 8/1995 | Sasaki et al. | |
| 5,442,191 A | 8/1995 | Ma | |
| 5,442,561 A | 8/1995 | Yoshizawa et al. | |
| 5,444,016 A | 8/1995 | Abrokwah et al. | |
| 5,450,812 A | 9/1995 | McKee et al. | 117/84 |
| 5,452,118 A | 9/1995 | Maruska | |
| 5,453,727 A | 9/1995 | Shibasaki et al. | |
| 5,466,631 A | 11/1995 | Ichikawa et al. | |
| 5,473,047 A | 12/1995 | Shi | |

| Patent No. | Date | Name | Ref |
|---|---|---|---|
| 5,473,171 A | 12/1995 | Summerfelt | |
| 5,478,653 A | 12/1995 | Guenzer | 428/446 |
| 5,479,033 A | 12/1995 | Baca et al. | |
| 5,479,317 A | 12/1995 | Ramesh | |
| 5,480,829 A | 1/1996 | Abrokwah et al. | |
| 5,481,102 A | 1/1996 | Hazelrigg, Jr. | |
| 5,482,003 A | 1/1996 | McKee et al. | 117/108 |
| 5,484,664 A | 1/1996 | Kitahara et al. | |
| 5,486,406 A | 1/1996 | Shi | |
| 5,491,461 A | 2/1996 | Partin et al. | |
| 5,492,859 A | 2/1996 | Sakaguchi et al. | |
| 5,494,711 A | 2/1996 | Takeda et al. | |
| 5,504,035 A | 4/1996 | Rostoker et al. | |
| 5,504,183 A | 4/1996 | Shi | |
| 5,511,238 A | 4/1996 | Bayraktaroglu | |
| 5,512,773 A | 4/1996 | Wolf et al. | |
| 5,514,484 A | 5/1996 | Nashimoto | 428/700 |
| 5,514,904 A | 5/1996 | Onga et al. | |
| 5,515,047 A | 5/1996 | Yamakido et al. | |
| 5,515,810 A | 5/1996 | Yamashita et al. | |
| 5,516,725 A | 5/1996 | Chang et al. | |
| 5,519,235 A | 5/1996 | Ramesh | |
| 5,528,057 A | 6/1996 | Yanagase et al. | |
| 5,528,067 A | 6/1996 | Farb et al. | |
| 5,528,414 A | 6/1996 | Oakley | |
| 5,530,235 A | 6/1996 | Stefik et al. | |
| 5,538,941 A * | 7/1996 | Findikoglu et al. | 250/336.2 |
| 5,541,422 A * | 7/1996 | Wolf et al. | 257/295 |
| 5,549,977 A | 8/1996 | Jin et al. | |
| 5,551,238 A | 9/1996 | Prueitt | |
| 5,552,547 A | 9/1996 | Shi | |
| 5,553,089 A | 9/1996 | Seki et al. | |
| 5,556,463 A | 9/1996 | Guenzer | 117/90 |
| 5,561,305 A | 10/1996 | Smith | |
| 5,569,953 A | 10/1996 | Kikkawa et al. | |
| 5,572,052 A | 11/1996 | Kashihara et al. | |
| 5,576,879 A | 11/1996 | Nashimoto | |
| 5,588,995 A | 12/1996 | Sheldon | 117/201 |
| 5,589,284 A * | 12/1996 | Summerfelt et al. | 252/518.1 |
| 5,596,205 A | 1/1997 | Reedy et al. | |
| 5,596,214 A | 1/1997 | Endo | |
| 5,602,418 A | 2/1997 | Imai et al. | |
| 5,603,764 A | 2/1997 | Matsuda et al. | |
| 5,606,184 A | 2/1997 | Abrokwah et al. | |
| 5,608,046 A | 3/1997 | Cook et al. | |
| 5,610,744 A | 3/1997 | Ho et al. | |
| 5,614,739 A | 3/1997 | Abrokwah et al. | |
| 5,619,051 A | 4/1997 | Endo | |
| 5,621,227 A | 4/1997 | Joshi | |
| 5,623,439 A | 4/1997 | Gotoh et al. | |
| 5,623,552 A | 4/1997 | Lane | |
| 5,629,534 A | 5/1997 | Inuzuka et al. | |
| 5,633,724 A | 5/1997 | King et al. | |
| 5,635,433 A | 6/1997 | Sengupta | |
| 5,640,267 A | 6/1997 | May et al. | |
| 5,650,646 A | 7/1997 | Summerfelt | |
| 5,656,382 A | 8/1997 | Nashimoto | |
| 5,659,180 A | 8/1997 | Shen et al. | |
| 5,661,112 A | 8/1997 | Hatta et al. | |
| 5,668,048 A | 9/1997 | Kondo et al. | |
| 5,670,798 A | 9/1997 | Schetzina | 257/96 |
| 5,670,800 A | 9/1997 | Nakao et al. | |
| 5,674,366 A | 10/1997 | Hayashi et al. | 204/298.09 |
| 5,679,965 A | 10/1997 | Schetzina | |
| 5,682,046 A | 10/1997 | Takahashi et al. | |
| 5,686,741 A | 11/1997 | Ohori et al. | |
| 5,689,123 A | 11/1997 | Major et al. | |
| 5,725,641 A | 3/1998 | MacLeod | |
| 5,729,394 A | 3/1998 | Sevier et al. | |
| 5,729,641 A | 3/1998 | Chandonnet et al. | |
| 5,731,220 A | 3/1998 | Tsu et al. | 437/60 |
| 5,733,641 A | 3/1998 | Fork et al. | |
| 5,734,672 A | 3/1998 | McMinn et al. | |
| 5,735,949 A | 4/1998 | Mantl et al. | 117/8 |
| 5,741,724 A | 4/1998 | Ramdani et al. | 437/128 |
| 5,745,631 A | 4/1998 | Reinker | |
| 5,753,300 A | 5/1998 | Wessels et al. | |
| 5,753,928 A | 5/1998 | Krause | |
| 5,754,319 A | 5/1998 | Van De Voorde et al. | |
| 5,760,426 A | 6/1998 | Marx et al. | |
| 5,760,427 A | 6/1998 | Onda | |
| 5,764,676 A | 6/1998 | Paoli et al. | |
| 5,767,543 A | 6/1998 | Ooms et al. | |
| 5,770,887 A | 6/1998 | Tadatomo et al. | |
| 5,776,359 A | 7/1998 | Schultz et al. | |
| 5,776,621 A | 7/1998 | Nashimoto | |
| 5,777,350 A | 7/1998 | Nakamura et al. | |
| 5,777,762 A | 7/1998 | Yamamoto | |
| 5,778,018 A | 7/1998 | Yoshikawa et al. | |
| 5,778,116 A | 7/1998 | Tomich | |
| 5,780,311 A | 7/1998 | Beasom et al. | |
| 5,789,733 A | 8/1998 | Jachimowicz et al. | |
| 5,789,845 A | 8/1998 | Wadaka et al. | |
| 5,790,583 A | 8/1998 | Ho | |
| 5,792,569 A | 8/1998 | Sun et al. | |
| 5,792,679 A | 8/1998 | Nakato | |
| 5,796,648 A | 8/1998 | Kawakubo et al. | |
| 5,801,072 A | 9/1998 | Barber | |
| 5,801,105 A | 9/1998 | Yano et al. | 438/785 |
| 5,807,440 A | 9/1998 | Kubota et al. | |
| 5,810,923 A | 9/1998 | Yano et al. | 117/84 |
| 5,812,272 A | 9/1998 | King et al. | |
| 5,814,583 A | 9/1998 | Itozaki et al. | |
| 5,825,055 A | 10/1998 | Summerfelt | |
| 5,825,799 A | 10/1998 | Ho et al. | |
| 5,827,755 A | 10/1998 | Yonehara et al. | |
| 5,828,080 A | 10/1998 | Yano et al. | 257/43 |
| 5,830,270 A | 11/1998 | McKee et al. | 117/106 |
| 5,833,603 A | 11/1998 | Kovacs et al. | |
| 5,834,362 A | 11/1998 | Miyagaki et al. | |
| 5,838,035 A | 11/1998 | Ramesh | |
| 5,844,260 A | 12/1998 | Ohori | |
| 5,846,846 A | 12/1998 | Suh et al. | |
| 5,852,687 A | 12/1998 | Wickham | |
| 5,857,049 A | 1/1999 | Beranek et al. | |
| 5,858,814 A | 1/1999 | Goossen et al. | |
| 5,861,966 A | 1/1999 | Ortel | |
| 5,863,326 A | 1/1999 | Nause et al. | |
| 5,869,845 A | 2/1999 | Vander Wagt et al. | |
| 5,872,493 A | 2/1999 | Ella | |
| 5,873,977 A * | 2/1999 | Desu et al. | 216/13 |
| 5,874,860 A | 2/1999 | Brunel et al. | 330/285 |
| 5,879,956 A | 3/1999 | Seon et al. | |
| 5,880,452 A | 3/1999 | Plesko | |
| 5,883,564 A | 3/1999 | Partin | |
| 5,883,996 A | 3/1999 | Knapp et al. | |
| 5,886,867 A | 3/1999 | Chivukula et al. | |
| 5,888,296 A | 3/1999 | Ooms et al. | |
| 5,889,296 A | 3/1999 | Imamura et al. | |
| 5,896,476 A | 4/1999 | Wisseman et al. | |
| 5,907,792 A | 5/1999 | Droopad et al. | |
| 5,912,068 A | 6/1999 | Jia | 428/210 |
| 5,926,493 A | 7/1999 | O'Brien et al. | |
| 5,926,496 A | 7/1999 | Ho et al. | |
| 5,937,274 A | 8/1999 | Kondow et al. | |
| 5,937,285 A | 8/1999 | Abrokwah et al. | |
| 5,948,161 A | 9/1999 | Kizuki | |
| 5,953,468 A | 9/1999 | Finnila et al. | |
| 5,955,591 A | 9/1999 | Imbach et al. | |
| 5,959,879 A | 9/1999 | Koo | |
| 5,962,069 A * | 10/1999 | Schindler et al. | 427/126.3 |
| 5,963,291 A | 10/1999 | Wu et al. | |

| Patent No. | Date | Inventor(s) | Class |
|---|---|---|---|
| 5,966,323 A | 10/1999 | Chen et al. | |
| 5,977,567 A | 11/1999 | Verdiell | |
| 5,981,400 A | 11/1999 | Lo | |
| 5,981,976 A | 11/1999 | Murasato | |
| 5,981,980 A | 11/1999 | Miyajima et al. | |
| 5,984,190 A | 11/1999 | Nevill | |
| 5,987,011 A | 11/1999 | Toh | |
| 5,990,495 A | 11/1999 | Ohba | |
| 5,995,359 A | 11/1999 | Klee et al. | |
| 5,995,528 A | 11/1999 | Fukunaga et al. | |
| 6,002,375 A | 12/1999 | Corman et al. | 343/853 |
| 6,008,762 A | 12/1999 | Nghiem | |
| 6,011,641 A | 1/2000 | Shin et al. | |
| 6,011,646 A | 1/2000 | Mirkarimi et al. | |
| 6,013,553 A | 1/2000 | Wallace et al. | |
| 6,020,222 A | 2/2000 | Wollesen | |
| 6,022,140 A | 2/2000 | Fraden et al. | |
| 6,022,410 A | 2/2000 | Yu et al. | |
| 6,022,963 A | 2/2000 | McGall et al. | |
| 6,023,082 A | 2/2000 | McKee et al. | |
| 6,028,853 A | 2/2000 | Haartsen | |
| 6,039,803 A | 3/2000 | Fitzgerald et al. | |
| 6,045,626 A | 4/2000 | Yano et al. | 148/33.4 |
| 6,046,464 A * | 4/2000 | Schetzina | 257/190 |
| 6,048,751 A | 4/2000 | D'Asaro et al. | |
| 6,049,702 A | 4/2000 | Tham et al. | |
| 6,051,858 A | 4/2000 | Uchida et al. | |
| 6,055,179 A | 4/2000 | Koganei et al. | 365/158 |
| 6,058,131 A | 5/2000 | Pan | |
| 6,064,078 A | 5/2000 | Northrup et al. | 257/96 |
| 6,064,092 A | 5/2000 | Park | |
| 6,078,717 A | 6/2000 | Nashimoto et al. | |
| 6,083,697 A | 7/2000 | Beecher et al. | |
| 6,087,681 A | 7/2000 | Shakuda | |
| 6,088,216 A | 7/2000 | Laibowitz et al. | |
| 6,090,659 A | 7/2000 | Laibowitz et al. | |
| 6,093,302 A | 7/2000 | Montgomery | |
| 6,096,584 A | 8/2000 | Ellis-Monaghan et al. | |
| 6,100,578 A | 8/2000 | Suzuki | |
| 6,103,008 A | 8/2000 | McKee et al. | 117/2 |
| 6,103,403 A | 8/2000 | Grigorian et al. | |
| 6,107,653 A | 8/2000 | Fitzgerald | 257/191 |
| 6,107,721 A | 8/2000 | Lakin | |
| 6,108,125 A | 8/2000 | Yano | |
| 6,113,690 A | 9/2000 | Yu et al. | 117/84 |
| 6,114,996 A | 9/2000 | Nghiem | |
| 6,121,642 A | 9/2000 | Newns | |
| 6,121,647 A | 9/2000 | Yano et al. | |
| 6,128,178 A | 10/2000 | Newns | |
| 6,134,114 A | 10/2000 | Ungermann et al. | |
| 6,136,666 A | 10/2000 | So | |
| 6,137,603 A | 10/2000 | Henmi | |
| 6,139,483 A | 10/2000 | Seabaugh et al. | |
| 6,143,072 A | 11/2000 | McKee et al. | 117/8 |
| 6,143,366 A | 11/2000 | Lu | |
| 6,146,906 A | 11/2000 | Inoue et al. | |
| 6,150,239 A | 11/2000 | Goesele et al. | |
| 6,153,010 A | 11/2000 | Kiyoku et al. | |
| 6,153,454 A | 11/2000 | Krivokapic | |
| 6,156,581 A | 12/2000 | Vaudo et al. | |
| 6,173,474 B1 | 1/2001 | Conrad | |
| 6,174,755 B1 | 1/2001 | Manning | |
| 6,175,497 B1 | 1/2001 | Tseng et al. | |
| 6,175,555 B1 | 1/2001 | Hoole | |
| 6,180,252 B1 | 1/2001 | Farrell et al. | |
| 6,180,486 B1 | 1/2001 | Leobandung et al. | |
| 6,184,044 B1 | 2/2001 | Sone et al. | |
| 6,184,144 B1 | 2/2001 | Lo | |
| 6,191,011 B1 | 2/2001 | Gilboa et al. | |
| 6,194,753 B1 | 2/2001 | Seon et al. | |
| 6,197,503 B1 | 3/2001 | Vo-Dinh et al. | |
| 6,204,737 B1 | 3/2001 | Ella | |
| 6,208,453 B1 | 3/2001 | Wessels et al. | |
| 6,210,988 B1 | 4/2001 | Howe et al. | |
| 6,211,096 B1 | 4/2001 | Allman et al. | |
| 6,222,654 B1 | 4/2001 | Frigo | |
| 6,224,669 B1 | 5/2001 | Yi et al. | |
| 6,225,051 B1 | 5/2001 | Sugiyama et al. | |
| 6,229,159 B1 | 5/2001 | Suzuki | |
| 6,232,910 B1 | 5/2001 | Bell et al. | |
| 6,235,145 B1 | 5/2001 | Li et al. | |
| 6,235,649 B1 | 5/2001 | Kawahara et al. | |
| 6,238,946 B1 | 5/2001 | Ziegler | |
| 6,239,449 B1 | 5/2001 | Fafard et al. | |
| 6,241,821 B1 | 6/2001 | Yu et al. | |
| 6,242,686 B1 | 6/2001 | Kishimoto et al. | |
| 6,248,459 B1 | 6/2001 | Wang et al. | |
| 6,248,621 B1 | 6/2001 | Wilk et al. | |
| 6,252,261 B1 | 6/2001 | Usui et al. | |
| 6,255,198 B1 | 7/2001 | Linthicum et al. | |
| 6,256,426 B1 | 7/2001 | Duchet | |
| 6,265,749 B1 | 7/2001 | Gardner et al. | |
| 6,268,269 B1 | 7/2001 | Lee et al. | |
| 6,271,619 B1 | 8/2001 | Yamada et al. | |
| 6,275,122 B1 | 8/2001 | Speidell et al. | |
| 6,277,436 B1 * | 8/2001 | Stauf et al. | 427/126.3 |
| 6,278,137 B1 | 8/2001 | Shimoyama et al. | |
| 6,278,138 B1 | 8/2001 | Suzuki | |
| 6,278,523 B1 | 8/2001 | Gorecki | |
| 6,291,319 B1 | 9/2001 | Yu et al. | |
| 6,297,842 B1 | 10/2001 | Koizumi et al. | |
| 6,300,615 B1 | 10/2001 | Shinohara et al. | |
| 6,306,668 B1 | 10/2001 | McKee et al. | |
| 6,312,819 B1 | 11/2001 | Jia et al. | |
| 6,313,486 B1 | 11/2001 | Kencke et al. | |
| 6,316,785 B1 | 11/2001 | Nunoue et al. | |
| 6,316,832 B1 | 11/2001 | Tsuzuki et al. | |
| 6,319,730 B1 | 11/2001 | Ramdani et al. | |
| 6,320,238 B1 | 11/2001 | Kizilyalli et al. | |
| 6,326,637 B1 | 12/2001 | Parkin et al. | |
| 6,326,645 B1 | 12/2001 | Kadota | |
| 6,338,756 B2 | 1/2002 | Dietze | |
| 6,339,664 B1 | 1/2002 | Farjady et al. | |
| 6,340,788 B1 | 1/2002 | King et al. | |
| 6,343,171 B1 | 1/2002 | Yoshimura et al. | |
| 6,345,424 B1 | 2/2002 | Hasegawa et al. | |
| 6,348,373 B1 | 2/2002 | Ma et al. | |
| 6,359,330 B1 | 3/2002 | Goudard | |
| 6,362,017 B1 | 3/2002 | Manabe et al. | |
| 6,367,699 B2 | 4/2002 | Ackley | |
| 6,372,356 B1 | 4/2002 | Thornton et al. | |
| 6,372,813 B1 | 4/2002 | Johnson et al. | |
| 6,389,209 B1 | 5/2002 | Suhir | |
| 6,391,674 B2 | 5/2002 | Ziegler | |
| 6,392,257 B1 | 5/2002 | Ramdani et al. | |
| 6,393,167 B1 | 5/2002 | Davis et al. | |
| 6,404,027 B1 | 6/2002 | Hong et al. | |
| 6,410,941 B1 | 6/2002 | Taylor et al. | |
| 6,410,947 B1 | 6/2002 | Wada | |
| 6,411,756 B2 | 6/2002 | Sadot et al. | |
| 6,417,059 B2 | 7/2002 | Huang | |
| 6,427,066 B1 | 7/2002 | Grube | |
| 6,432,546 B1 | 8/2002 | Ramesh et al. | |
| 6,438,281 B1 | 8/2002 | Tsukamoto et al. | |
| 6,461,927 B1 | 10/2002 | Mochizuki et al. | |
| 6,462,360 B1 | 10/2002 | Higgins, Jr. et al. | |
| 2001/0013313 A1 | 8/2001 | Droopad et al. | |
| 2002/0006245 A1 | 1/2002 | Kubota et al. | |
| 2002/0008234 A1 | 1/2002 | Emrick | |
| 2002/0030246 A1 | 3/2002 | Eisenbeiser et al. | |
| 2002/0047123 A1 | 4/2002 | Ramdani et al. | |
| 2002/0047143 A1 | 4/2002 | Ramdani et al. | |

| | | |
|---|---|---|
| 2002/0072245 A1 | 6/2002 | Ooms et al. |
| 2002/0131675 A1 | 9/2002 | Litvin |

FOREIGN PATENT DOCUMENTS

| | | |
|---|---|---|
| EP | 0 331 467 | 9/1989 |
| EP | 0 342 937 | 11/1989 |
| EP | 0342937 | 11/1989 |
| EP | 0 455 526 | 6/1991 |
| EP | 0455526 | 6/1991 |
| EP | 0 483 993 | 5/1992 |
| EP | 0250171 | 11/1992 |
| EP | 0 514 018 | 11/1992 |
| EP | 0514018 | 11/1992 |
| EP | 0 538 611 | 4/1993 |
| EP | 0 581 239 | 2/1994 |
| EP | 0 602 568 | 6/1994 |
| EP | 0602568 | 6/1994 |
| EP | 0 607 435 | 7/1994 |
| EP | 0607435 | 7/1994 |
| EP | 0 630 057 | 12/1994 |
| EP | 0 682 266 | 11/1995 |
| EP | 0 711 853 | 5/1996 |
| EP | 0 777 379 | 6/1997 |
| EP | 0 810 666 | 12/1997 |
| EP | 0 875 922 | 11/1998 |
| EP | 0 881 669 | 12/1998 |
| EP | 0 884 767 | 12/1998 |
| EP | 0 926 739 | 6/1999 |
| EP | 0 957 522 | 11/1999 |
| EP | 0 964 259 | 12/1999 |
| EP | 0 964 453 | 12/1999 |
| EP | 0 993 027 | 4/2000 |
| EP | 0 999 600 | 5/2000 |
| EP | 0999600 | 5/2000 |
| EP | 1 001 468 | 5/2000 |
| EP | 1001468 | 5/2000 |
| EP | 1 043 426 | 10/2000 |
| EP | 1 043 765 | 10/2000 |
| EP | 1 069 606 | 1/2001 |
| EP | 1 085 319 | 3/2001 |
| GB | 1 319 311 | 6/1970 |
| GB | 1319311 | 6/1973 |
| GB | 2 335 792 | 9/1999 |
| JP | 5208835 | 7/1977 |
| JP | 52-88354 | 7/1977 |
| JP | 52-135684 | 11/1977 |
| JP | 5413455 | 10/1979 |
| JP | 54-134554 | 10/1979 |
| JP | 5508742 | 7/1980 |
| JP | 55-87424 | 7/1980 |
| JP | 58-075868 | 5/1983 |
| JP | 58-213412 | 12/1983 |
| JP | 60-210018 | 10/1985 |
| JP | 60-212018 | 10/1985 |
| JP | 61-36981 | 2/1986 |
| JP | 61-63015 | 4/1986 |
| JP | 6110818 | 5/1986 |
| JP | 61-108187 | 5/1986 |
| JP | 6303499 | 2/1988 |
| JP | 63-34994 | 2/1988 |
| JP | 6313110 | 6/1988 |
| JP | 63-131104 | 6/1988 |
| JP | 6319836 | 8/1988 |
| JP | 63-198365 | 8/1988 |
| JP | 63-289812 | 11/1988 |
| JP | 1052329 * | 2/1989 |
| JP | 64-50575 | 2/1989 |
| JP | 64-52329 | 2/1989 |
| JP | 1-102435 | 4/1989 |
| JP | 1-179411 | 7/1989 |
| JP | HEI 2-391 | 1/1990 |
| JP | 2000039 | 1/1990 |
| JP | 02051220 | 2/1990 |
| JP | 3-41783 | 2/1991 |
| JP | 03-188619 | 8/1991 |
| JP | 5-48072 | 2/1993 |
| JP | 5048072 | 2/1993 |
| JP | 5-086477 | 4/1993 |
| JP | 05150143 | 6/1993 |
| JP | 5-152529 | 6/1993 |
| JP | 6334168 | 6/1993 |
| JP | 5-291299 | 11/1993 |
| JP | 06-069490 | 3/1994 |
| JP | 6232126 | 8/1994 |
| JP | 6-232126 | 8/1994 |
| JP | 6291299 | 10/1994 |
| JP | 6-291299 | 10/1994 |
| JP | 6-334168 | 12/1994 |
| JP | 0812494 | 1/1996 |
| JP | 9-67193 | 3/1997 |
| JP | 9-82913 | 3/1997 |
| JP | 10-256154 | 9/1998 |
| JP | 10-303396 | 11/1998 |
| JP | 10-321943 | 12/1998 |
| JP | 11135614 | 5/1999 |
| JP | 1123868 | 8/1999 |
| JP | 11-238683 | 8/1999 |
| JP | 1126083 | 9/1999 |
| JP | 11-260835 | 9/1999 |
| JP | 11340542 | 12/1999 |
| JP | 2000-068466 | 3/2000 |
| JP | 2 000 1645 | 6/2000 |
| JP | 2000-351692 | 12/2000 |
| JP | 2002-9366 | 1/2002 |
| WO | WO 92/10875 | 6/1992 |
| WO | WO 93/07647 | 4/1993 |
| WO | WO 94/03908 | 2/1994 |
| WO | WO 97/45827 | 12/1997 |
| WO | WO 98/05807 | 1/1998 |
| WO | WO 98/20606 | 5/1998 |
| WO | WO 99/14797 | 3/1999 |
| WO | 9914804 | 3/1999 |
| WO | WO 99/14804 | 3/1999 |
| WO | WO 99/19546 | 4/1999 |
| WO | 9963580 | 12/1999 |
| WO | WO 99/63580 | 12/1999 |
| WO | WO 00/06812 | 2/2000 |
| WO | WO 00/16378 | 3/2000 |
| WO | WO 00/33363 | 6/2000 |
| WO | WO 00/48239 | 8/2000 |
| WO | WO 01/16395 | 3/2001 |
| WO | WO 01/33585 | 5/2001 |
| WO | WO 01/37330 | 5/2001 |
| WO | WO 01/59814 A2 | 8/2001 |
| WO | WO 01/59820 A1 | 8/2001 |
| WO | WO 01/59821 A1 | 8/2001 |
| WO | WO 02 01648 | 1/2002 |
| WO | WO 02/03113 | 1/2002 |
| WO | WO 02/03467 | 1/2002 |
| WO | WO 02/03480 | 1/2002 |
| WO | WO 02/09160 A2 | 1/2002 |
| WO | WO 02/33385 A2 | 4/2002 |
| WO | WO 02/47127 A2 | 6/2002 |
| WO | WO 02/50879 | 6/2002 |

OTHER PUBLICATIONS

"GaInAs Superconducting FET," IBM Technical Bulletin, vol. 36, No. 8, Aug. 1993, p. 655.

"Epitaxial 3d Structure Using Mixed Spinel," IBM Technical Bulletin, vol. 30, No. 3, Aug. 1987, p. 1271.

"Roles of Buffer Layers in Epitaxial Growth of SrTiO$_3$ Films on Silicon Substrates," Moon et al., Japan J of Appl Phys., vol. 33, 1994. pp. 1472–1477.

"GaAs Heteroepitaxial Growth on Si Substrates with Thin Si Interlayers in Situ Annealed at High Temperatures," Yodo et al., 8257b Journal of Vacuum Science & Technology, 1995, No. 3, pp. 1000–1005.

"Substrate Effect on the Superconductivity of Yba$_2$Cu$_3$O$_7$ Thin Films," Cuomo et al., AIP conference 1988, pp. 141–148.

"Crystalline Oxides on Silicon: The First Five Monolayers,", McKee et al., Physical Review Letters, vol. 81, No. 14, Oct. 1998, pp. 3014–3017.

"Molecular Beam Epitaxy Growth of Epitaxial Barium Silicide, Barium Oxide, and Barium Titanate on Silicon," McKee et al., 1991 American Institute of Physics, pp. 782–284.

"Molecular Beam Epitaxy Growth of SrTiO$_3$ Films on Si(100)–2 x 1 with SrO Buffer Layer," Tambo et al., Jpn. J. Appl. Phys., vol. 37, 1998 pp. 4454–4459.

"The MBE Growth and Optical Quality of BaTiO$_3$ and SrTiO$_3$ Thin Films on MgO," MeKee et al., Mat. Res. Soc. Symp. Proc. vol. 341, 1994, pp. 309–314.

"BaSi$_2$ and Thin Film Alkaline Earth Silicides on Silicon," McKee et al., Appl. Phys. Lett. 63 (20), Nov. 1993, pp. 2818–2820.

"Surface Structures and the Orthohombic Transformation of Thin Film BaSi$_2$ on Silicon," McKee et al., Mat. Res. Soc. Symp. Proc. vol. 221, pp. 131–136.

"Epitaxial Growth of SrTiO$_3$ Films on Si(100) Substrates Using a Focused Electron Beam Evaporation Method," Mori et al. Jpn. J . of Appl. Phys., vol. 30, No. 8a, Aug. 1991, pp. 1415–1417.

"Growth of Crystalline SrTiO$_3$ Films on Si Substrates Using Thin Fluoride Buffer Layers and Their Electrical Properties," Moon et al., Jpn. J. of Apl. Phys., vol. 33, (1994), pp. 5911–5916.

"The Epitactic Growth of Oxides on Si," S. Summerfelt, Materials Research Society Symposium Proceedings, vol. 221, 1991, pp. 29–34.

"Oriented Growth of SrTiO$_3$ Films on Si(100) Substrates Using in situ Cleaning by Excited Hydrogen," H. Ishiwara et al., Mat. Res. Symp., vol. 116, 1988., pp. 369–374.

"A Preliminary Consideration of the Growth Behavior of CeO$_2$, SrTiO$_3$ and SrVO$_3$ Films on Si Substrate," Nagata et al., Thin Solid Films, 224, 1993, pp. 1–3.

"Heteroepitaxial Growth of CeO$_2$(001) Films on Si(001) Substrates by Pulsed Laser Deposition in Ultrahigh Vacuum," Nagata et al., Jpn. J. Appl. Phys., vol. 30, No. 6b, 1991, pp. 1136–1138.

"Heteroepitaxial Growth of SrO Films on Si Substrates," Kado et al., J. Appl. Phys., 61(6), 1987, pp. 2398–2400.

"Epitaxial Growth of Perovskite Type Oxide Films on Si Substrates," H. Ishiwara et al., Mat. Res. Soc. Symp., vol. 220, 1991, pp. 595–600.

"Effects of Buffer Layers in Epitaxial Growth of SrTiO$_3$ Thin Film on Si(100)," Nakagawara et al., J. Appl. Phys. 78(12), 1995, pp. 7226–7230.

"A Proposal of Epitaxial Oxide Thin Film Structures for Future Oxide Electronics," Suzuki et al., Materials Science and Engineering B41 (1996), pp. 166–173.

"Optimizing GMR Spin Valves: The Outlook for Improved Properties", W. F. Englhoff et al., 1998 Int'l NonVolatile Memory Technology Conference, pp. 34–37.

"Processing and Performance of Piezoelectric Films", Y. Wang et al., Univ. of MD, Wilcoxon Research Co., and Motorola Labs.

"Nonlinear acoustoelectric interactions in GaAs/LiNbO$_3$ structures", M. Rotter et al., 1999 American Institute of Physics, pp. 965–967.

"Surface acoustic wave propagation on lead zirconate titanate thin films", K. Sreenivas et al., App. Phys. Lett. 52(9), Feb. 29, 1988, pp. 709–711.

"Single Chip fused hybrids for acousto–electric and acousto–optic applications", M. Rotter et al., 1997 American Institute of Physics, pp. 2097–2099.

"Surface Acoustic Wave Propagation in PZT/YBCO/SrTiO$_3$ and PbTi O$_3$/YBCO/SrTiO$_3$ Epitaxial Heterostructures", Dept. of Physics & Astrophysics, Univ. of Delhi, pp. 275–283.

"Ferroelectric Field Effect Transistor Based on Epitaxial Perovskite Heterostructures", S. Mathews et al., American Association for the Advancement of Science, 1997, pp. 238–240.

"Formation of Si Epi./MgO—Al$_2$O$_3$ Epi./Si0$_3$Si and Its Epitaxial Film Quality," Masao Mikami et al., Fundamental Research Laboratories and Microelectronics Laboratories, pp. 31–34.

"An Epitaxial Si/Insulator/Si Structure Prepared by Vacuum Deposition of CaF$_2$ and Silicon," T. Asano et al., Graduate School of Science and Engineering, Tokyo Institute of Technology, pp. 143–151.

"Reaction of Regrowth Control of CeO$_2$ on Si(111) Surface for the Silicon–On–Insulator Structure," T. Chikyow et al., Appl. Phys. Lett. 65(8), Aug. 22, 1994, pp. 1030–1032.

"Epitaxial Growth of CeO$_2$(100) Films on Si(100) Substrates by Dual Ion Beams Reactive Sputtering," J.F. Kang et al., Solid State Communications, vol. 108, No. 4, pp. 225–227.

"Vertical–Cavity Surface–Emitting Lasers Come of Age," Robert A. Morgan et al., SPIE, vol. 2683, pp. 18–29.

"Technical Analysis of Qualcomm QCP–800 Portable Cellular Phone(Transmitter Circuitry)," Talus Corporation, Qualcomm QCP–800 Technical Analysis Report, Dec. 10, 1996, pp. 5–8.

"Properties of GaAs Si Grown by Molecular Beam Epitaxy, "R. Houdre et al., Solid State and Molecular Sciences, 1990, pp. 91–114.

"Gallium Arsenide and Other Compound Semiconductors on Silicon," S.F. Fang et al., J. Appl. Phys. 68(7), Oct. 1, 1990, pp. R31–R58.

"Impact of GaAs Buffer Thickness on electronic Quality of GaAs Grown on Graded Ge/Ge/Si/Si Substrates," Carlin et al., Appl. Phys. Letter, vol. 76, No. 14, Apr. 2000, pp. 1884–1886.

"Epitaxial Integration of III–V Materials and Devices with Si Using Graded GeSi Buffers," Ringel et al., 27th International Symposium on Compound Semiconductors, Oct. 2000.

"Progress in Compound–Semiconductor–on–Silicon–Heteroepitaxy with Fluoride Buffer Layers," Zogg et al., J. Electrochem. Soc., vol. 136, No. 3, Mar. 1989, pp. 775–779.

"Oxide Defined GaAs Vertical–Cavity Surface–Emitting Lasers on Si Substrates," Xiong et al., IEEE Photonics Tech Letters, vol. 12, No. 2, Feb. 2000, pp. 110–112.

"Investigation of PZT/?LSCO/Pt//Aerogel Thin Film Composites for Uncooled Pyroelectric IR Detectors," Clem et al., Mat. Res. Soc. Symp. vol. 541, p. 661–666.

"Bound–To–Quasi–Bound Quantum–Well Infrared Photodectors," Gunapala et al., NASA Tech Brief, vol. 22, No. 9.

"Monolithic InGaAs–on–silicon Short Wave Infrared Detector Arrays," Joshi et al., Int'l Society for Optical Engineering, vol. 2999, pp. 211–224.

"Nanostructure and Chemistry of a (100)Mg)/(100)GaAs Interface," Bruley et al., Appl. Phys. Lett. 65(5), Aug. 1994, pp. 564–566.

"Epitaxial MgO on Si(001) for Y—Ba—Cu—O Thin Film Growth by Pulsed Laser Deposition," Fork et al., Appl. Phys Lett 58(20), May 1991, pp. 2294–2296.

"Dialectrics on Semiconductors," Himpsel et al., Materials Science and Engineering, B1(1988), pp. 9–13.

"Epitaxial La 0.67 Sr 0.33 $MnO_3$ Magnetic Tunnel Junctions," J. Appl. Phys. 81(8), Apr. 1997 pp. 5509–5511.

"Colossal Magnetoresistance Magnetic Tunnel Junctions Grown by Molecular–Beam Epitaxy," O'Donnell et al., Appl. Phys. Letters, bol. 76, No. 14, Apr. 2000, pp. 1914–1916.

Nakagawara et al., Effects of Buffer Layers in Epitaxial Growth of $SrTiO_3$ Thin Film on Si(100), *J. Appl. Phys.*, 78 (12), Dec. 15, 1995, pp. 7226–7230.

Suzuki et al., "A Proposal of Epitaxial Oxide Thin Film Structures For Future Oxide Electronics," *Material Science and Engineering B41*, (1996), pp. 166–173.

W. F. Egelhoff et al., "Optimizing GMR Spin Valves: The Outlook for Improved Properties", *1998 Int'l Non Volatile Memory Technology Conference*, pp. 34–37.

Wang et al., "Processing and Performance of Piezoelectric Films", Univ. Of MD, Wilcoxon Research Col, and Motorola Labs, May 11, 2000.

M. Rotter et al., "Nonlinear Acoustoelectric Interactions in $GaAs/LiNbO_3$ Structures", *Applied Physics Letters*, vol. 75(7), Aug. 16, 1999, pp. 965–967.

K. Sreenivas et al., "Surface Acoustic Wave Propagation on Lead Zirconate Titanate Thin Films," *Appl. Phys. Lett.* 52(9), Feb. 29, 1998, pp. 709–711.

M. Rotter et al., "Single Chip Fused Hybrids for Acousto–Electric and Acousto–Optic Applications," *1996 Applied Physics Letters*, vol. 70(16), Apr. 21, 1997, pp. 2097–2099.

A. Mansingh et al., "Surface Acoustic Wave Propagation in $PZT/YBCO/SrTiO_3$ Epitaxial Heterostructures," *Ferroelectric*, vol. 224, pp. 275–282, S. Mathews et al., "Ferroelectric Field Effect Transistor Based on Epitaxial Perovskite Heterostructures", Science, vol. 276, Apr. 11, 1997, pp. 238–240.

R. Houdre et al., "Properties of GaAs on Si Grown by Molecular Beam Epitaxy," *Solid State and Materials Sciences*, vol. 16, Issue 2, 1990, pp. 91–114.

S.F. Fang et al., "Gallium Arsenide and Other Compound Semiconductors on Silicon," *J. Appl. Phys.*, 68(7), Oct. 1, 1990, pp. R31–R58.

Carlin et al., Impact of GaAs Buffer Thickness on Electronic Quality of GaAs Grown on Graded Ge/GeSi/Si Substrates, *Appl. Phys. Letter*, vol. 76, No. 14, Apr. 2000, pp. 1884–1886.

Ringel et al., "Epitaxial Integration of III–V Materials and Devices with Si Using Graded GeSi Buffers," 27th International Symposium on Compound Semiconductors, Oct. 2000.

Zogg et al., "Progress in Compound–Semiconductor–on––Silicon–Heteroepitaxy with Fluoride Buffer Layers," *J. Electrochem Soc.*, vol. 136, No. 3, Mar. 1998, pp. 775–779.

Xiong et al., "Oxide Defined GaAs Vertical–Cavity Surface–Emitting Lasers on Si Substrates," *IEEE Photonics Technology Letters*, vol. 12, No. 2, Feb. 2000, pp. 110–112.

Clem et al., "Investigation of PZT//LSCO//Pt//Aerogel Thin Film Composites for Uncooled Pyroelectric IR Detectors," *Mat. Res. Soc. Symp. Proc.*, vol. 541, pp. 661–666, 1999.

Gunapala et al., "Bound–To–Quasi–Bound Quantum–Well Infrared Photodetectors," NASA Tech Brief, vol. 22, No. 9, Sep. 1998.

Abhay M. Joshi et al., "Monolithic InGaAs–on–silicon Wave Infrared Detector Arrays," *Intn. Society for Optical Engineering*, vol. 2999, pp. 221–224.

Bruley et al., "Nanostructure and Chemistry of a (100)MgO(100) GaAs Interface," *Appl. Phys. Lett*, 65(5), Aug. 1994, pp. 564–566.

Fork et al., "Epitaxial MgO On Si(001) for Y—Ba—Cu—O Thin Film Growth by Pulsed Laser Deposition," *Appl. Phys. Lett.*, 58(20), May 20, 1991, pp. 2294–2296.

Himpsel et al., "Dialectrics on Semiconductors," *Materials Science and Engineering*, B1(1988), pp. 9–13.

Li et al., "Epitaxial La $_{0.67}Sr_{0.33}MnO_3$ Magnetic Tunnel Junctions," *J. Appl. Phys.* 81(8), Apr. 15, 1997, pp. 5509–5511.

O'Donnell et al., "Colossal Magnetoresistance Magnetic Tunnel Junctions Grown by Molecular–Beam Epitaxy," *Appl. Physics Letters*, vol. 76, No. 14, Apr. 3, 2000, pp. 1914–1916.

Mikami et al., "Formation of Si Epi/MgO—$Al_2O_3$Epi./$SiO_3$Si and its Epitaxial Film Quality," Fundamental Research Laboratories and Microelectronics Laboratories, pp. 31–34, 1983.

T. Asano et al., "An Epitaxial Si/Insulator/Si Structure Prepared by Vacuum Deposition of $CaF_2$ and Silicon," *Thin Solid Films*, vol. 93 (1982), pp. 143–150.

T. Chikyow et al., "Reaction and Regrowth Control of $CeO_2$ on Si(111) Surface for the Silicon–On–Insulator Structure," *Appl. Phys. Lett.*, vol. 65, No. 8, Aug. 22, 1994, pp. 1030–1032.

J.F. Kang, et al., "Epitaxial Growth of $CeO_2$(100) Films on Si(100) Substrates by Dual Ion Beams Reactive Sputtering," *Solid State Communications*, vol. 108, No. 4, pp. 225–227, 1998.

R.A. Morgan et al., "Vertical–Cavity Surface–Emitting Lasers Come of Age," *SPIE*, vol. 2683, pp. 18–29.

"Technical Analysis of Qualcomm QCP–800 Portable Cellular Phone (Transmitter Circuitry)," Talus Corporation, Qualcomm QCP–800 Technical Analysis Report, Dec. 10, 1996, pp. 5–8.

Jo–Ey Wong, et al.; "An Electrostatically–Actuated MEMS Switch for Power Applications"; IEEE, 2000; pp. 633–638.

T. Mizuno, et al., "Electron and Hole Mobility Enhancement in Strained–Si MOSFET's on SiGe–on–Insulator Substrates Fabricated by SIMOX Technology"; IEEE Electron Device Letters, vol. 21, No. 5, May 2000; pp. 230–232.

F.M. Buffer, et al.; "Strain–dependence of electron transport in bulk Si and deep–submicron MOSFET's" Computatural Electronics, 2000, Book of Abstracts, IWCE Glasgow 2000, 7th Int'l Workshop on, 2000; pp. 64–65.

S.S. Lu, et al.; "Piezoelectric field effect transistor (PEFET) using $In_{0.2}Ga_{0.8}As/Al_{0.35}Ga_{0.65}As/In_{0.2}Ga_{0.8}As/GaAs$ Strained layer structure on (111)B GaAs substrate"; Electronics Letters, 12th Ma 1994, vol. 30, No. 10; pp. 823–825.

Kihong Kim, et al. " On–Chip Wireless Interconnection with Integrated Antennas"; 2000 IEEE; pp. 20.2.1–20.3.4.

G. Passiopoulos, et al.; "V–Band Single Chip, Direct Carrier BPSK Modulation Transmitter with Integrated Patch Antenna"; 1998 IEEE MTT–S Digest; pp. 305–308.

Mau–Chung Frank Chang, et al. "RF/Wireless Interconnect for Inter– and Intra–Chip Communications"; Proceedings of the IEEE, vol. 89, No. 4, Apr. 2001; pp. 456–466.

The Electronics Industry Report; Prismark; 2001; pp. 111–120.

J.K. Abrokwah, et al.; "A Manufacturable Complementary GaAs Process", GaAs IC Symposium, IEEE, 1993; pp. 127–130.

H. Nataga, "A Preliminary Consideration of the Growth Behaviour of $CeO_2$, $SrTiO_3$ and $SrVO_3$ Films on Si Substrate," *Thin Solid Films*, 224, 1993, pp. 1–3.

Nagata et al., "Heteroepitaxial Growth of $CeO_2(001)$ Films on Si(001) Substrates by Pulsed Laser Deposition in Ultrahigh Vacuum," *Jpn. Jour. Appl. Phys.*, vol. 30, No. 6B, Jun. 1991, pp. L1136–L1138.

Kado et al., "Heteroepitaxial Growth of SrO Films on Si Substrates," *J. Appl. Phys.*, 61(6), Mar. 15, 1987, pp. 2398–2400.

H. Ishiwara et al., "Epitaxial Growth of Perovskite Type Oxide Films on Substrates"; *Materials Research Symposium Proceedings*, vol. 220, pp. 595–600, Apr. 29–May 3, 1991.

J.K. Abrokwah, et al.; "A Manufacturable High–Speed Low–Power Complementary GaAs Process"; Extended Abstracts of the 1994 International Conference on Solid State Devices and Materials, Yokohama, 1994, pp. 592–594.

C.J. Palmstrom et al.; "Stable and Epitaxial Contacts to III–V Compound Semiconductors"; Contacts to Semiconductors Fundamentals and Technology; Noyles Publications, 1993, pp. 67–150.

Jayshri Sabarinathat, et al.; "Submicron three–dimensional infrared $GaAs/Al_xO_y$–based photonic crystal using single–step epitaxial growth"; Applied Physics Letters, vol. 78, No. 20, May 14, 2001; pp. 3024–3026.

Philip Ball; "The Next Generation of Optical Fibers"; Technology Review, May 2001; pp. 55–61.

John D. Joannopoulos, et al.; "Molding the Flow of Light"; Photonic Crystals; Princeton University Press, 1995.

Thomas F. Krauss, et al.; "Photonic crystals in the optical regime—past, present and future"; Progress in Quantum Electronics 23 (1999) 51–96.

G. H. Jin, et al.; "PLZT Film Waveguide Mach–Zehnder Electrooptic Modulator"; Journal of Lightwave Technology, vol. 18, No. 6, Jun. 2000; pp. 807–812.

D.E. Aspnes, et al., "Steps on (001) silicon surfaces"; J. Vac. Sci. Technol. B, vol. 5, No. 4, Jul./Aug. 1987; pp. 939–944.

D.M. Newns, et al.; "Mott transition field effect transistor"; Applied Physics Letters, vol. 73, No. 6, Aug. 10, 1998; pp. 780–782.

Lucent Technologies, Inc. "Arrayed Waveguide Grating Multiplexer/Demultiplexer"; Jan. 2000; 4 pages.

Hisashi Schichjo, et al.; "Co–Integration of GaAs MESFET and Si CMOS Circuits"; IEEE Electron Device Letters, vol. 9, No. 9, Sep. 1988; pp. 444–446.

H. Shichijo, et al.; "GaAs MESFET and Si CMOS Cointegration and Circuit Techniques"; 1988 IEEE, GaAs IC Symposium–239–242.

H. Shichijo, et al.; "Monolithic Process for Co–Integration of GaAs and Silicon Circuits"; 1988 IEEE; pp. 778–781.

Z.H. Zhu, et al. "Growth of InGaAs multi–quantum wells at 1.3 m wavelength on GaAs compliant substrates"; Applied Physics Letters, vol. 72, No. 20, May 18, 1998; pp. 2598–2600.

Kurt Eisenbeiser, et al.; "Metamorphic InAIAs/InGaAs Enhancement Mode HEMT's on GaAs Substrates"; IEEE Electron Device Letters, vol. 20, No. 10, Oct. 1999; pp. 507–509.

Tomonori Nagashima, et al.; "Three–Terminal Tandem Solar Cells With a Back–Contact Type Bottom Cell" Higashifuji Technical Center, Toyota Motor Corporation; 4 pages.

James Schellenberg, et al.; "Low–Loss, Planar Monolithic Baluns for K/Ka–Band Applications"; 1999 IEEE MTT–S Digest; pp. 1733–1736.

Arnold Leitner et al; "Pulsed Laser Deposition of Superconducting Strontium Titanate Thin–Films"; ; Session K11–Thin Films and Borocarbides; Mixed Session, Wednesday Afternoon; Mar. 19, 1997; Room 1202 B, Conv. Center (Abstract).

R.D. Vispute; "High quality optoelectronic grade epitaxial AIN films on $-Al_2O_3$, Si and 6H—SIC by pulsed laser deposition"; Thin Solid Films 299 (1997), pp. 94–103.

T. Warren Weeks, et al.; "GaN thin films deposited via organometallic vapor phase epitaxy on (6H)—SIC(0001) using high–temperature monocrystalline AIN buffer layers", 320 Applied Physics Letters, vol. 67, No. 3, Jul. 27, 1995, pp1401–403.

Z. Yu, et al., "Epitaxial oxide thin films on Sl(001)*"; J. Vac. Sci. Technol. B. vol. 18, No. 4, Jul./Aug. 2000; pp. 2139–2145.

Gentex Corporate Website; Photoelectric Smoke Detectors—How They Work; 2001.

Jeffrey B. Casady, et al.; "A Hybrid 6H—SIC Temperature Sensor Operational from 25 C to 500 C"; IEEE Transactions on Components, Packaging, and Manufacturing Technology—Part A, vol. 29, No. 3, Sep. 1996; pp. 416–422.

Ronald W. Waynant, et al.; "Optoelectronic Integrated Circuits"; Electro–Optics Handbook, McGraw–Hill, Inc., 1994; Chapter Twenty Seven.

Antonio Mecozzi, et al.; "The Roles of Semiconductor Optical Amplifiers in Optical Networks"; Optics & Photonics News; Mar. 2001; pp. 37–42.

D.A. Francis, et al.; "a single–chip linear optical amplifier"; OFC, 2001; Mar. 17–22, 2001.

G. Vogg et al.; "Epitaxial alloy films of zintl–phase Ca(Si1–xGex)2"; Journal of Crystal Growth 223 (2001); pp. 573–576.

Peter S. Guilfoyle, et al.; "Optoelectronic Architecture for High–Speed Switching and Processing Applications"; 1998 The Photonics Design and Applications Handbook; pp. H–399–H406.

Gerald B. Stringfellow; "Organometallic Vapor–Phase Epitaxy: Theory and Practice"; Departments of Materials Science and Engineering and Electrical Engineering, University of Utah; Academic Press, 1989.

M.A. Herman, et al.; "Molecular Beam Epitaxy Fundamentals and Current Status"; Springer–Verlag Berlin Heidelberg, 1989, 1996.

"Integration of GaAs on Si Using a Spinel Buffer Layer", IBM Technical Bulletin, vol. 30, No. 6, Nov. 1987, p. 365.

"Epitaxial 3d Structure Using Mixed Spinels," IBM Technical Bulletin, vol. 30, No. 3, Aug. 1987, p. 1271.

Moon et al., "Roles of Buffer Layers in Epitaxial Growth of SrTiO$_3$ Films on Silicon Substrates," *Japan J of Appl. Phys.*, vol. 33, Mar. 1994, pp. 1472–1477.

Yodo et al., GaAs Heteroepitaxial Growth on Si Substrates with Thin Si Interlayers in situ Annealed at High Temperatures, *8257b Journal of Vacuum Science & Technology*, May/Jun. 1995, vol. 13, No. 3, pp. 1000–1005.

Cuomo et al., "Substrate Effect on the Superconductivity of YBa$_2$Cu$_3$O$_7$ Thin Films," AIP Conference 1988, pp. 141–148.

McKee et al., "Crystalline Oxides on Silicon: The First Five Monolayers," *Physical Review Letters*, vol. 81, No. 14, Oct. 1998, pp. 3014–3017.

McKee et al., "Molecular Beam Epitaxy Growth of Epitaxial Barium Silicide, Barium Oxide, and Barium Titanate on Silicon," *1991 American Institute of Physics*, pp. 782–784, Aug. 13, 1991.

Tambo et al., Molecular Beam Epitaxy Growth of SrTiO$_3$ Films on Si(100)–2x1 with SrO Buffer Layer, *Jpn. J. Appl. Phys.*, vol. 37, 1998, pp. 4454–4459.

McKee et al., "The MBE Growth and Optical Quality of BaTiO$_3$ and SrTiO$_3$ Thin Films on MgO," *Mat. Res. Soc. Symp. Proc.*, vol. 341, Apr. 1994, pp. 309–314.

McKee et al., "BaSi$_2$ and Thin Film Alkaline Earth Silicides on Silicon," *Appl. Phys. Lett.*, 63 (20), Nov. 1993, pp. 2818–2820.

McKee et al., "Surface Structures and the Orthorhombic Transformation on Thin Film BaSi$_2$ on Silicon," *Mat. Res. Soc. Symp. Proc.*, vol. 221, pp. 131–136.

Brian A. Floyd, et al.; "The projected Power Consumption of a Wireless Clock Distribution System and Comparison to Conventional Distribution Systems"; IEEE, 1999; pp. IITC99–249–ITTC99–250.

Mori et al., "Epitaxial Growth of SrTiO$_3$ Films on Si(100) Substrates Using a Focused Electron Beam Evaporation Method," *Jpn. J. of Apl. Phys.*, vol. 30, No. 8A, Aug. 1991, pp. L1415–1417.

Moon et al., "Growth of Crystalline SrTiO$_3$ Films on Substrates Using Thin Fluoride Buffer Layers and Their Electrical Properties," *Jpn. J. of Appl. Phys.*, vol. 33, (1994), pp. 5911–5916.

Farrow et al., "Heteroepitaxy of Dissimilar Materials," *Mat. Res. Soc. Symposium Proceedings*, vol. 221, pp. 29–34, Apr. 29–May 2, 1991.

Ishiwara et al., "Heteroepitaxy on Silicon: Fundamentals, Structure, and Devices," *Mat. Res. Soc.* Symposium Proceedings, vol. 116, pp. 369–374, Apr. 5–8, 1988.

Douglas B. Chrisey, et al; Pulsed Laser Deposition of Thin Films; pp. 273–285.

B.A. Block, et al; "Photoluminescence properties of Er$^3$-doped BaTiO$_3$ thin films"; Appl. Phys. Lett 65(1), Jul. 4, 1994, pp. 25–27.

Kevin J. Chen et al; "A Novel Ultrafast Functional Device: Resonant Tunneling High Electron Mobility Transistor"; Electron Devices Meetingk 1996; IEEE Hong Kong; Jun. 29, 1996; pp. 60–63, XP010210167.

Wenhua Zhu et al.; "Molecular Beam Epitaxy of GaAs on Si–on–Insulator"; 320 Applied Physics Letters 59 Jul. 8, 1991 No. 2; pp. 210–212.

Umesh K. Mishra et al.; "Oxide Based Compound Semiconductor Electronics"; Electron Devices Meeting; 1997; Technical Digest, International; Washington, D.C.; Dec. 7–10, 1997; pp. 545–548.

J.M. Daughton et al., "Applications of Spin Dependent Transport Materials"; J. Phys. D. Appl. Phys. 32(1999) R169–R177.

Wei Zhang et al.; "Stress Effect and Enhanced Magnetoresistance in La$_{0.67}$Ca$_{0.33}$MnO$_{3-\delta}$ Films"; Physical Review, B. Condensed Matter; American Institute of Physics; vol. 58, No. 21, Part 1; Dec. 1, 1998; pp. 14143–14146.

Q.-Y. Tong et al., "IOS—a new type of materials combination for system–on–a chip preparation"; 1999 IEEE International SOI Conference, Oct. 1999; pp. 104–105.

T. Kanniainen et al.; "Growth of Dielectric 1hfo2/Ta205 Thin Film Nanolaminate Capacitors By Atomic Layer Epitaxy"; Electrochemical Society Proceedings, U.S. Electrochemical Society; Pennington, N.J.; Aug. 31, 1997; pp. 36–46.

Myung Bok Lee; "Heteroepitaxial Growth of BaTio$_3$ Films on Si by Pulsed Laser Deposition"; Applied Physics Letters; Mar. 13, 1995; pp. 1331–1333.

Myung Bok Lee; "Formation and Characterization of Epitaxial TiO$_2$ and BaTiO$_3$/TiO$_2$ Films on Si Substrate"; Japan Journal of Applied Physics Letters; vol. 34; 1995; pp. 808–811.

Gilbert Lecarpentier et al.; "High Accuracy Machine Automated Assembly for Opto Electronics"; 2000 Electronic Components and Technology Conference; pp. 1–4.

R. Ramesh; "Ferroelectric La—Sr—Co—O/Pb—Zr—Ti—O/La—Sr—Co—O Heterostructures on Silicon via Template Growth"; 320 Applied Physics Letters; 63(1993); Dec. 27, No. 26; pp. 3592–3594.

K. Eisenbeiser; "Field Effect Transistors with SrTiO$_3$ Gate Dielectric on Si"; Applied Physics Letters; vol. 76, No. 10; Mar. 6, 2000; pp. 1324–1326.

Stephen A. Mass; "Microwave Mixers"; Second Edition; 2pp.

Douglas J. Hamilton et al.; "Basic Integrated Circuit Engineering"; pp. 2; 1975.

Takeshi Obata: "Tunneling Magnetoresistance at Up to 270 K in La$_{0.8}$Sr$_{0.2}$MnO$_3$/SrTiO$_3$/La$_{0.8}$Sr$_{0.2}$MnO$_3$ Junctions with 1.6–nm–Thick Barriers"; Applied Physics Letters; vol. 74, No. 2; Jan. 11, 1999; pp. 290–292.

Wei Zhang et al.; "Enhanced Magnetoresistance in La—Ca—Mn—O Films on Si Substrates Using YbaCuO/CeO$_2$ Heterostructures"; Physica C; vol. 282–287, No. 2003; Aug. 1, 1997; pp. 1231–1232.

Shog Imada et al.; "Epitaxial Growth of Ferroelectric YmnO$_3$ Thin Films on Si(111) Substrates by Molecular Beam Epitaxy"; Jpn. J. Appl. Phys. vol. 37 (1998); pp. 6497–6501; Part 1, No. 12A, Dec. 1998.

Ladislav Pust et al.; "Temperature Dependence of the Magnetization Reversal in Co(fcc)—BN—Co(poly hcp) Structures"; Journal of Applied Physics; vol. 85, No. 8; Apr. 15, 1999; pp. 5765–5767.

C. Martinez; "Epitaxial Metallic Nanostructures on GaAs"; Surface Science; vol. 482–485; pp. 910–915; 2001.

Wen–Ching Shih et al.; "Theoretical Investigation of the SAW Properties of Ferroelectric Film Composite Structures"; IEEE Transactions of Ultrasonics, Ferroelectrics, and Frequency Control; vol. 45, No. 2; Mar. 1998; pp. 305–316.

Zhu Dazhong et al.; "Design of ZnO/SiO$_2$/Si Monolithic Integrated Programmable SAW Filter"; Proceedings of Fifth International Conference on Solid–State and Integrated Circuit Technology; 21–23; Oct. 1998; pp. 826–829.

Kirk–Othmer Encyclopedia of Chemical Technology; Fourth Edition, vol. 12; Fuel Resources to Heat Stabilizers; A Wiley–Interscience Publication; ;John Wiley & Sons.

Joseph W. Goodman et al; "Optical Interconnections For VLSI Systems"; Proceedings of the IEEE, vol. 72, No. 7 Jul. 1984.

Fathimulla et al.; "Monolithic Integration of InGaAs/InAIAs MODFETs and RTDs on InP–bonded–to Si Substrate"; Fourth International Conference on Indium Phosphide and Related Materials, Newport, RI, USA; Apr. 21–24, 1992; pp. 167–170; XP000341253; IEEE, New York; NY, USA; ISBN: 0–7803–0522–1.

H. Takahashi et al.; "Arrayed–Waveguide Grating For Wavelength Division Multi/Demultiplexer With Nanometre REsolution"; Electronics Letters; vol. 26., No. 2, Jan. 18, 1990.

Pierret, R.F.; "1/J–FET and MESFET"; Field Effect Devices; MA, Addison–Wesley; 1990; pp. 9–22.

M. Schreiter, et al.; "Sputtering of Self–Polarized PZT Films for IR–Detector Arrays"; 1998 IEEE; pp. 181–185.

Hideaki Adachi et al.; "Sputtering Preparation of Ferroelectric PLZT Thin Films and Their Optical Applications"; IEEE Transactions of Ultrasonics, Ferroelectrics and Frequency Control, vol. 38, No. 6, Nov. 1991.

A.J. Moulson et al.; "Electroceramics Materials Properties Applications"; Chapman & Hall; pp. 366–369.

P.A. Langjahr et al.; "Epitaxial Growth and Structure of Cubic and Pseudocubic Perovskite Films on Perovskite Substrates"; Mat. Res. Soc. Symp. Proc., vol. 401; 1995 Materials Research Society; pp. 109–114.

Wang et al.; "Depletion–Mode GaAs MOSFETs with Negligible Drain Current Drift and Hysteresis"; Electron Devices Meeting, 1998, IEDM '98 Technical Digest; pp. 67–70.

Ben G. Streetman; "Solid–State Electronic Devices"; 1990, Prentice–Hall; Third Edition; pp. 320–322.

A. Y Wu et al.; "Highly Oriented $(Pb,La)(Zr,Ti)O_3$ Thin Films on Amorphous Substrates"; IEEE, 1992; pp. 301–304.

Timothy E. Glassman et al.; "Evidence for Cooperative Oxidation of MoCVD Precursors Used in $Ba_xSr_{1-x}TiO_3$ Film Growth"; Mat. Res. Soc. Symp. Proc. vol. 446, 1997 Materials Research Society; pp. 321–326.

S.N. Subbarao et al.; "Monolithic PIN Photodector and FET Amplifier on GaAs—os—Si"; IEEE; GaAs IC Symposium—163–166; 1989.

T.A. Lando et al.; "High Quality Ge on Si by Epitaxial Necking"; Applied Physics Letters; vol. 76, No. 25; pp. 3700–3702; Jun. 19, 2000.

Chenning Hu et al.; Solar Cells From Basics to Advanced Systems; McGraw–Hill Book Company; 1983.

O.J. Painter et al.; "Room Temperature Photonic Crystal Defect Lasers at Near–Infrared Wavelengths in InGaAsp"; Journal of Lightwave Technology, vol. 17, No. 11; Nov. 1999.

C. Donn et al.; "A 16–Element, K–Band Monolithic Active Receive Phased Array Antenna"; Antennas and Propagation Society International Symposium, 1988; pp. 188–191, vol. 1; Jun. 6–10, 1988.

Don W. Shaw; "Epitaxial GaAs on Si: Progress and Potential Applications"; Mat. Res. Soc. Symp. Proc.; pp. 15–30; 1987.

G.J.M. Dormans, et al.; "$PbTiO_3$/Thin Films Grown by Organometallic Chemical Vapour Deposition"; Third International Symposium on Integrated Ferroelectrics; Apr. 3–5, 1991 (Abstract).

P.J. Borelli et al.; "Compositional and Structural Properties of Sputtered PLZT Thin Films", Ferroelectric Thin Films II Symnposium; Dec. 2–4, 1991 (Abstract).

Ranu Nayak et al; "Enhanced acousto–optic diffraction efficiency in a symmetric SrRiO3/BaTiO3/SrTiO3 thin–film heterostructure"; Nov. 1, 2000; vol. 39, No. 31; Applied Optics; pp. 5847–5853.

Ranu Nayak et al.; "Studies on acousto–optical interaction in SrTiO3/BaTiO3/SrTiO3 epitaxial thin film heterostructures"; J. Phys. D: Appl. Phys. 32 (1999) 380–387.

S.K. Tewksbury et al.; "Cointegration of Optoelectronics and Submicron CMOS"; Wafer Scale Integration; 1993; Proceedings, Fifth Annual IEEE; Jan. 20, 1993; pp. 358–367.

V. Kaushik et al.; "Device Characteristics of Crystalline Epitaxial Oxides on Silicon"; Device Research Conference, 2000; Conference Digest 58th DRC; pp. 17–20; Jun. 19–20, 2000.

Katherine Derbyshire; "Prospects Bright for Optoelectronics Volume, Cost Drive Manufacturing for Optical Applications"; Semiconductor Magazine; vol. 3, No. 3; Mar. 2002.

Alex Chediak et al; "Integration of GaAs/Si with Buffer Layers and Its Impact on Device Integration"; TICS 4, Prof. Sands. MSE 225, Apr. 23, 2002; pp. 1–5.

S. A. Chambers et al; "Band Discontinuities at Epitaxial SrTiO3/Si(001) Heterojunctions"; Applied Physics Letters; vol. 77, No. 11; Sep. 11, 2000; pp. 1662–1664.

H. Wang et al.; "GaAs/GaAIAs Power HBTs for Mobile Communications"; Microwave Symposium Digest; 1993 IEEE; vol. 2.; pp. 549–552.

Y. Ota et al.; "Application of Heterojunction FET to Power Amplifier for Cellular Telephone"; Electronics Letters, May 26, 1994; vol. 30, No. 11; pp. 906–907.

Keiichi Sakuno et al; "A 3.5W HBT MMIC Power Amplifier Module for Mobile Communications"; IEEE 1994; Microwave and Millimeter–Wave Monolithic Circuits Symposium; pp. 63–66.

Mitsubishi Semiconductors Press Release (GaAs FET's) Nov. 8, 1999 pp. 1–2.

R.J. Matyi et al; "Selected Area Heteroepitaxial Growth of GaAs on Silicon for Advanced Device Structures"; 2194 Thin Solid Films; 181 Dec. 10, 1989; No. 1; pp. 213–225.

K. Nashimoto et al; "Patterning of Nb, LaOnZr, TiO3 Waveguides for Fabricating Micro–Optics Using Wet Etching and Solid–Phase Epitaxy"; Applied Physics Letters; vol. 75, No. 8: Aug. 23, 1999; pp. 1054–1056.

Bang–Hung Tsao et al; "Sputtered Barium Titanate and Barium Strontium Titanate Films for Capacitor Applications"; Applications of Ferroelectrics, 2000; Proceedings of the 2000 12th International Symposium on vol. 2; pp. 837–840.

Man Fai Ng et al; "Heteroepitaxial growth of lanthanum aluminate films derived from mixed metal nitrates"; Journal of Materials Research; vol. 12, No. 5; pp. 1306.

Yuji Matsumoto et al.; "Room–Temperature Ferromagnetism in Transparent Transition Metal–Doped Titanium Dioxide"; Science; Feb. 2, 2001; vol. 291; pp. 854–856.

S.A. Chambers et al.; "Epitaxial Growth and Properties of Ferromagnetic Co–Doped TiO2 Analase"; Applied Physics Letters; vol. 79, No. 21; Nov. 19, 2001; pp. 3467–3469.

* cited by examiner

GROWTH OF COMPOUND SEMICONDUCTOR STRUCTURES ON PATTERNED OXIDE FILMS AND PROCESS FOR FABRICATING SAME

FIELD OF THE INVENTION

This invention relates generally to semiconductor structures and devices and to a method for their fabrication, and more specifically to compound semiconductor structures and devices and a method for growing such structures and devices on patterned oxide layers deposited on silicon.

BACKGROUND OF THE INVENTION

The vast majority of semiconductor discrete devices and integrated circuits are fabricated from silicon, at least in part because of the availability of inexpensive, high quality monocrystalline silicon substrates. Other semiconductor materials, such as the so called compound semiconductor materials, have physical attributes, including wider bandgap and/or higher mobility than silicon, or direct bandgaps that make these materials advantageous for certain types of semiconductor devices. Unfortunately, compound semiconductor materials are generally much more expensive than silicon and are not available in large wafers as is silicon. Gallium arsenide (GaAs), the most readily available compound semiconductor material, is available in wafers only up to about 150 millimeters (mm) in diameter. In contrast, silicon wafers are available up to about 300 mm and are widely available at 200 mm. The 150 mm GaAs wafers are many times more expensive than are their silicon counterparts. Wafers of other compound semiconductor materials are even less available and are more expensive than GaAs.

Because of the desirable characteristics of compound semiconductor materials, and because of their present generally high cost and low availability in bulk form, for many years attempts have been made to grow thin films of the compound semiconductor materials on a foreign substrate. To achieve optimal characteristics of the compound semiconductor material, however, a monocrystalline film of high crystalline quality is desired. Attempts have been made, for example, to grow layers of a monocrystalline compound semiconductor material on germanium, silicon, and various insulators. These attempts have generally been unsuccessful because lattice mismatches between the host crystal and the grown crystal have caused the resulting thin film of compound semiconductor material to be of low crystalline quality having a large number of dislocations and defects.

If a large area thin film of high quality monocrystalline compound semiconductor material was available at low cost, a variety of semiconductor devices could advantageously be fabricated in that film at a low cost compared to the cost of fabricating such devices on a bulk wafer of compound semiconductor material or in an epitaxial film of such material on a bulk wafer of compound semiconductor material. In addition, if a thin film of high quality monocrystalline compound semiconductor material could be realized on a bulk wafer such as a silicon wafer, an integrated device structure could be achieved that took advantage of the best properties of both the silicon and the compound semiconductor material.

Previous attempts to grow large lattice mismatch layers on GaAs have resulted in the lattice mismatch layers having a large number of threading dislocations beyond the critical thickness of the layers thereby degrading device performance. In order to reduce the number of dislocations, further attempts were made to grow these layers on patterned substrates so that the strain energy could be relieved through the sidewalls.

However, this growth of compound semiconductor materials, such as Group III–V compounds, was done on costly GaAs substrates. Aside from the obvious high expense involved in using GaAs substrates, the GaAs wafers are much smaller in size than the preferred silicon substrates.

Accordingly, a need exists for a high crystalline quality compound semiconductor material that can be grown on a less expensive and more accessible substrate to more cost effectively produce reliable semiconductor components and devices.

BRIEF DESCRIPTION OF THE DRAWINGS

The present invention is illustrated by way of example and not limitation in the accompanying figures, in which like references indicate similar elements, and in which:

FIGS. 9–13 illustrate schematically, in cross section, device structures in accordance with other various embodiments of the invention which are grown on oxide layers deposited on silicon.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

DETAILED DESCRIPTION OF THE DRAWINGS

Figure 1:
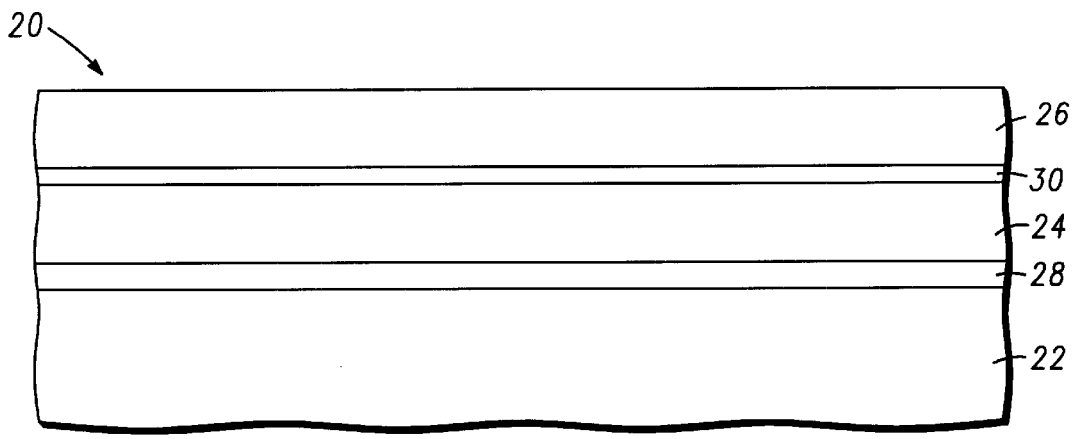
FIGS. 1–3 and 11–12 illustrate schematically, in cross section, device structures in accordance with various embodiments of the invention.

FIG. 1 illustrates schematically, in cross section, a portion of a semiconductor structure 20 in accordance with an embodiment of the invention. Semiconductor structure 20 includes a monocrystalline substrate 22, accommodating buffer layer 24 comprising a monocrystalline material, and a layer 26 of a monocrystalline compound semiconductor material. In this context, the term "monocrystalline" shall have the meaning commonly used within the semiconductor industry. The term shall refer to materials that are a single crystal or that are substantially a single crystal and shall include those materials having a relatively small number of defects such as dislocations and the like as are commonly found in substrates of silicon or germanium or mixtures of silicon and germanium and epitaxial layers of such materials commonly found in the semiconductor industry.

In accordance with one embodiment of the invention, structure 20 also includes an amorphous intermediate layer 28 positioned between substrate 22 and accommodating buffer layer 24. Structure 20 may also include a template layer 30 between the accommodating buffer layer and compound semiconductor layer 26. As will be explained more fully below, the template layer helps to initiate the growth of the compound semiconductor layer on the accommodating buffer layer. The amorphous intermediate layer helps to relieve the strain in the accommodating buffer layer and by doing so, aids in the growth of a high crystalline quality accommodating buffer layer.

Substrate 22, in accordance with an embodiment of the invention, is a monocrystalline semiconductor wafer, preferably of large diameter. The wafer can be of a material from Group IV of the periodic table, and preferably a material from Group IVA. Examples of Group IV semiconductor materials include silicon, germanium, mixed silicon and germanium, mixed silicon and carbon, mixed silicon, germanium and carbon, and the like. Preferably substrate 22 is a wafer containing silicon or germanium, and most preferably is a high quality monocrystalline silicon wafer as used in the semiconductor industry. Accommodating buffer layer 24 is preferably a monocrystalline oxide or nitride material epitaxially grown on the underlying substrate. In accordance with one embodiment of the invention, amorphous intermediate layer 28 is grown on substrate 22 at the interface between substrate 22 and the growing accommodating buffer layer by the oxidation of substrate 22 during the growth of layer 24. The amorphous intermediate layer serves to relieve strain that might otherwise occur in the monocrystalline accommodating buffer layer as a result of differences in the lattice constants of the substrate and the buffer layer. As used herein, lattice constant refers to the distance between atoms of a cell measured in the plane of the surface. If such strain is not relieved by the amorphous intermediate layer, the strain may cause defects in the crystalline structure of the accommodating buffer layer. Defects in the crystalline structure of the accommodating buffer layer, in turn, would make it difficult to achieve a high quality crystalline structure in monocrystalline compound semiconductor layer 26.

Accommodating buffer layer 24 is preferably a monocrystalline oxide or nitride material selected for its crystalline compatibility with the underlying substrate and with the overlying compound semiconductor material. For example, the material could be an oxide or nitride having a lattice structure substantially matched to the substrate and to the subsequently applied semiconductor material. Materials that are suitable for the accommodating buffer layer include metal oxides such as the alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lanthanum aluminate, lanthanum scandium oxide, and gadolinium oxide. Additionally, various nitrides such as gallium nitride, aluminum nitride, and boron nitride may also be used for the accommodating buffer layer. Most of these materials are insulators, although strontium ruthenate, for example, is a conductor. Generally, these materials are metal oxides or metal nitrides, and more particularly, these metal oxide or nitrides typically include at least two different metallic elements. In some specific applications, the metal oxides or nitride may include three or more different metallic elements.

Amorphous interface layer 28 is preferably an oxide formed by the oxidation of the surface of substrate 22, and more preferably is composed of a silicon oxide. The thickness of layer 28 is sufficient to relieve strain attributed to mismatches between the lattice constants of substrate 22 and accommodating buffer layer 24. Typically, layer 28 has a thickness in the range of approximately 0.5–5 nm.

The compound semiconductor material of layer 26 can be selected, as needed for a particular semiconductor structure, from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), gallium indium arsenide (GaInAs), gallium aluminum arsenide (GaAlAs), indium phosphide (InP), cadmium sulfide (CdS), cadmium mercury telluride (CdHgTe), zinc selenide (ZnSe), zinc sulfur selenide (ZnSSe), and the like. Suitable template materials chemically bond to the surface of the accommodating buffer layer 24 at selected sites and provide sites for the nucleation of the epitaxial growth of the subsequent compound semiconductor layer 26. Appropriate materials for template 30 are discussed below.

Figure 2:

FIG. 2 illustrates, in cross section, a portion of a semiconductor structure 40 in accordance with a further embodiment of the invention. Structure 40 is similar to the previously described semiconductor structure 20, except that an additional buffer layer 32 is positioned between accommodating buffer layer 24 and layer of monocrystalline compound semiconductor material 26. Specifically, the additional buffer layer is positioned between template layer 30 and the overlying layer of compound semiconductor material. The additional buffer layer, formed of a semiconductor or compound semiconductor material, serves to provide a lattice compensation when the lattice constant of the accommodating buffer layer cannot be adequately matched to the overlying monocrystalline compound semiconductor material layer.

Figure 3:
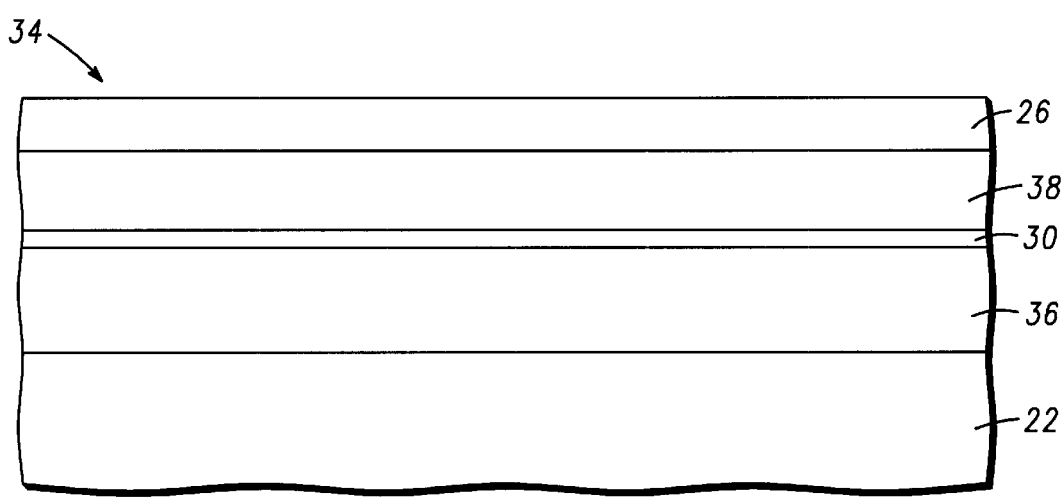

FIG. 3 schematically illustrates, in cross section, a portion of a semiconductor structure 34 in accordance with another exemplary embodiment of the invention. Structure 34 is similar to structure 20, except that structure 34 includes an amorphous layer 36, rather than accommodating buffer layer 24 and amorphous interface layer 28, and an additional semiconductor layer 38.

As explained in greater detail below, amorphous layer 36 may be formed by first forming an accommodating buffer layer and an amorphous interface layer in a similar manner to that described above. Monocrystalline semiconductor layer 26 is then formed (by epitaxial growth) overlying the monocrystalline accommodating buffer layer. The accommodating buffer layer is then exposed to an anneal process to convert the monocrystalline accommodating buffer layer to an amorphous layer. Amorphous layer 36 formed in this manner comprises materials from both the accommodating buffer and interface layers, which amorphous layers may or may not amalgamate. Thus, layer 36 may comprise one or two amorphous layers. Formation of amorphous layer 36 between substrate 22 and semiconductor layer 38 (subsequent to layer 38 formation) relieves stresses between layers 22 and 38 and provides a true compliant substrate for subsequent processing—e.g., compound semiconductor layer 26 formation.

The processes previously described above in connection with FIGS. 1 and 2 are adequate for growing monocrystalline compound semiconductor layers over a monocrystalline substrate. However, the process described in connection with FIG. 3, which includes transforming a monocrystalline accommodating buffer layer to an amorphous oxide layer, may be better for growing monocrystalline compound semiconductor layers because it allows any strain in layer 26 to relax.

Semiconductor layer 38 may include any of the materials described throughout this application in connection with either of compound semiconductor material layer 26 or additional buffer layer 32. For example, layer 38 may include monocrystalline Group IV or monocrystalline compound semiconductor materials.

In accordance with one embodiment of the present invention, semiconductor layer 38 serves as an anneal cap during layer 36 formation and as a template for subsequent semiconductor layer 26 formation. Accordingly, layer 38 is preferably thick enough to provide a suitable template for layer 26 growth (at least one monolayer) and thin enough to allow layer 38 to form as a substantially defect free monocrystalline semiconductor compound.

In accordance with another embodiment of the invention, semiconductor layer 38 comprises compound semiconductor material (e.g., a material discussed above in connection with compound semiconductor layer 26) that is thick enough to form devices within layer 38. In this case, a semiconductor structure in accordance with the present invention does not include compound semiconductor layer 26. In other words, the semiconductor structure in accordance with this embodiment only includes one compound semiconductor layer disposed above amorphous oxide layer 36.

The following non-limiting, illustrative examples illustrate various combinations of materials useful in structures 20, 40, and 34 in accordance with various alternative embodiments of the invention. These examples are merely illustrative, and it is not intended that the invention be limited to these illustrative examples.

EXAMPLE 1

In accordance with one embodiment of the invention, monocrystalline substrate 22 is a silicon substrate oriented in the (100) direction. The silicon substrate can be, for example, a silicon substrate as is commonly used in making complementary metal oxide semiconductor (CMOS) integrated circuits having a diameter of about 200–300 mm. In accordance with this embodiment of the invention, accommodating buffer layer 24 is a monocrystalline layer of $Sr_zBa_{1-z}TiO_3$ where z ranges from 0 to 1 and the amorphous intermediate layer is a layer of silicon oxide ($SiO_x$) formed at the interface between the silicon substrate and the accommodating buffer layer. The value of z is selected to obtain one or more lattice constants closely matched to corresponding lattice constants of the subsequently formed layer 26. The accommodating buffer layer can have a thickness of about 2 to about 100 nanometers (nm) and preferably has a thickness of about 10 nm. In general, it is desired to have an accommodating buffer layer thick enough to isolate the compound semiconductor layer from the substrate to obtain the desired electrical and optical properties. Layers thicker than 100 nm usually provide little additional benefit while increasing cost unnecessarily; however, thicker layers may be fabricated if needed. The amorphous intermediate layer of silicon oxide can have a thickness of about 0.5–5 nm, and preferably a thickness of about 1.5–2.5 nm.

In accordance with this embodiment of the invention, compound semiconductor material layer 26 is a layer of gallium arsenide (GaAs) or aluminum gallium arsenide (AlGaAs) having a thickness of about 1 nm to about 100 micrometers ($\mu$m) and preferably a thickness of about 0.5 $\mu$m to 10 $\mu$m. The thickness generally depends on the application for which the layer is being prepared. To facilitate the epitaxial growth of the gallium arsenide or aluminum gallium arsenide on the monocrystalline oxide, a template layer is formed by capping the oxide layer. The template layer is preferably 1–10 monolayers of Ti—As, Sr—O—As, Sr—Ga—O, or Sr—Al—O. By way of a preferred example, 1–2 monolayers of Ti—As or Sr—Ga—O have been shown to successfully grow GaAs layers.

EXAMPLE 2

In accordance with a further embodiment of the invention, monocrystalline substrate 22 is a silicon substrate as described above. The accommodating buffer layer is a monocrystalline oxide of strontium or barium zirconate or hafnate in a cubic or orthorhombic phase with an amorphous intermediate layer of silicon oxide formed at the interface between the silicon substrate and the accommodating buffer layer. The accommodating buffer layer can have a thickness of about 2–100 nm and preferably has a thickness of at least 5 nm to ensure adequate crystalline and surface quality and is formed of a monocrystalline $SrZrO_3$, $BaZrO_3$, $SrHfO_3$, $BaSnO_3$ or $BaHfO_3$. For example, a monocrystalline oxide layer of $BaZrO_3$ can grow at a temperature of about 700 degrees C. The lattice structure of the resulting crystalline oxide exhibits a 45 degree rotation with respect to the substrate silicon lattice structure.

An accommodating buffer layer formed of these zirconate or hafnate materials is suitable for the growth of compound semiconductor materials in the indium phosphide (InP) system. The compound semiconductor material can be, for example, indium phosphide (InP), indium gallium arsenide (InGaAs), aluminum indium arsenide, (AlInAs), or aluminum gallium indium arsenic phosphide (AlGaInAsP), having a thickness of about 1.0 nm to 10 $\mu$m. A suitable template for this structure is 1–10 monolayers of zirconium-arsenic (Zr—As), zirconium-phosphorus (Zr—P), hafnium-arsenic (Hf—As), hafnium-phosphorus (Hf—P), strontium-oxygen-arsenic (Sr—O—As), strontium-oxygen-phosphorus (Sr—O—P), barium-oxygen-arsenic (Ba—O—As), indiumstrontium-oxygen (In—Sr—O), or barium-oxygen-phosphorus (Ba—O—P), and preferably 1–2 monolayers of one of these materials. By way of an example, for a barium zirconate accommodating buffer layer, the surface is terminated with 1–2 monolayers of zirconium followed by deposition of 1–2 monolayers of arsenic to form a Zr—As template. A monocrystalline layer of the compound semiconductor material from the indium phosphide system is then grown on the template layer. The resulting lattice structure of the compound semiconductor material exhibits a 45 degree rotation with respect to the accommodating buffer layer lattice structure and a lattice mismatch to (100) InP of less than 2.5%, and preferably less than about 1.0%.

EXAMPLE 3

In accordance with a further embodiment of the invention, a structure is provided that is suitable for the growth of an epitaxial film of a II–VI material overlying a silicon substrate. The substrate is preferably a silicon wafer as described above. A suitable accommodating buffer layer material is $Sr_xBa_{1-x}TiO_3$, where x ranges from 0 to 1, having a thickness of about 2–100 nm and preferably a thickness of about 5–15 nm. The II–VI compound semiconductor material can be, for example, zinc selenide (ZnSe) or zinc sulfur selenide (ZnSSe). A suitable template for this material system includes 1–10 monolayers of zinc-oxygen (Zn—O) followed by 1–2 monolayers of an excess of zinc followed by the selenidation of zinc on the surface. Alternatively, a template can be, for example, 1–10 monolayers of strontium-sulfur (Sr—S) followed by the ZnSeS.

EXAMPLE 4

This embodiment of the invention is an example of structure 40 illustrated in FIG. 2. Substrate 22, monocrystalline oxide layer 24, and monocrystalline compound semiconductor material layer 26 can be similar to those described in example 1. In addition, an additional buffer layer 32 serves to alleviate any strains that might result from a mismatch of the crystal lattice of the accommodating buffer layer and the lattice of the monocrystalline semiconductor material. Buffer layer 32 can be a layer of germanium or a GaAs, an aluminum gallium arsenide (AlGaAs), an indium gallium phosphide (InGaP), an aluminum gallium phosphide (AlGaP), an indium gallium arsenide (InGaAs), an aluminum indium phosphide (AlInP), a gallium arsenide phosphide (GaAsP), or an indium gallium phosphide (InGaP) strain compensated superlattice. In accordance with one aspect of this embodiment, buffer layer 32 includes a $GaAs_xP_{1-x}$ superlattice, wherein the value of x ranges from 0 to 1. In accordance with another aspect, buffer layer 32 includes an $In_yGa_{1-y}P$ superlattice, wherein the value of y ranges from 0 to 1. By varying the value of x or y, as the case may be, the lattice constant is varied from bottom to top across the superlattice to create a match between lattice constants of the underlying oxide and the overlying compound semiconductor material. The compositions of other materials, such as those listed above, may also be similarly varied to manipulate the lattice constant of layer 32 in a like manner. The superlattice can have a thickness of about 50–500 nm and preferably has a thickness of about 100–200 nm. The template for this structure can be the same of that described in example 1. Alternatively, buffer layer 32 can be a layer of monocrystalline germanium having a thickness of 1–50 nm and preferably having a thickness of about 2–20 nm. In using a germanium buffer layer, a template layer of either germanium-strontium (Ge—Sr) or germanium-titanium (Ge—Ti) having a thickness of about one monolayer can be used as a nucleating site for the subsequent growth of the monocrystalline compound semiconductor material layer. The formation of the oxide layer is capped with either a monolayer of strontium or a monolayer of titanium to act as a nucleating site for the subsequent deposition of the monocrystalline germanium. The monolayer of strontium or titanium provides a nucleating site to which the first monolayer of germanium can bond.

EXAMPLE 5

This example also illustrates materials useful in a structure 40 as illustrated in FIG. 2. Substrate material 22, accommodating buffer layer 24, monocrystalline compound semiconductor material layer 26 and template layer 30 can be the same as those described above in example 2. In addition, a buffer layer 32 is inserted between the accommodating buffer layer and the overlying monocrystalline compound semiconductor material layer. The buffer layer, a further monocrystalline semiconductor material, can be, for example, a graded layer of indium gallium arsenide (InGaAs) or indium aluminum arsenide (InAlAs). In accordance with one aspect of this embodiment, buffer layer 32 includes InGaAs, in which the indium composition varies from 0 to about 47%. The buffer layer preferably has a thickness of about 10–30 nm. Varying the composition of the buffer layer from GaAs to InGaAs serves to provide a lattice match between the underlying monocrystalline oxide material and the overlying layer of monocrystalline compound semiconductor material. Such a buffer layer is especially advantageous if there is a lattice mismatch between accommodating buffer layer 24 and monocrystalline compound semiconductor material layer 26.

EXAMPLE 6

This example provides exemplary materials useful in structure 34, as illustrated in FIG. 3. Substrate material 22, template layer 30, and monocrystalline compound semiconductor material layer 26 may be the same as those described above in connection with example 1.

Amorphous layer 36 is an amorphous oxide layer which is suitably formed of a combination of amorphous intermediate layer materials (e.g., layer 28 materials as described above) and accommodating buffer layer materials (e.g., layer 24 materials as described above). For example, amorphous layer 36 may include a combination of $SiO_x$ and $Sr_zBa_{1-z}TiO_3$ (where z ranges from 0 to 1), which combine or mix, at least partially, during an anneal process to form amorphous oxide layer 36.

The thickness of amorphous layer 36 may vary from application to application and may depend on such factors as desired insulating properties of layer 36, type of semiconductor material comprising layer 26, and the like. In accordance with one exemplary aspect of the present embodiment, layer 36 thickness is about 2 nm to about 10 nm, preferably about 2–10 nm, and more preferably about 5–6 nm.

Layer 38 comprises a monocrystalline compound semiconductor material that can be grown epitaxially over a monocrystalline oxide material such as material used to form accommodating buffer layer 24. In accordance with one embodiment of the invention, layer 38 includes the same materials as those comprising layer 26. For example, if layer 26 includes GaAs, layer 38 also includes GaAs. However, in accordance with other embodiments of the present invention, layer 38 may include materials different from those used to form layer 26. In accordance with one exemplary embodiment of the invention, layer 38 is about 1 monolayer to about 100 nm thick.

Referring again to FIGS. 1–3, substrate 22 is a monocrystalline substrate such as a monocrystalline silicon substrate. The crystalline structure of the monocrystalline substrate is characterized by a lattice constant and by a lattice orientation. In similar manner, accommodating buffer layer 24 is also a monocrystalline material and the lattice of that monocrystalline material is characterized by a lattice constant and a crystal orientation. The lattice constants of the accommodating buffer layer and the monocrystalline substrate must be closely matched or, alternatively, must be such that upon rotation of one crystal orientation with respect to the other crystal orientation, a substantial match in lattice constants is achieved. In this context the terms "substantially equal" and "substantially matched" mean that there is sufficient similarity between the lattice constants to permit the growth of a high quality crystalline layer on the underlying layer.

Figure 4:
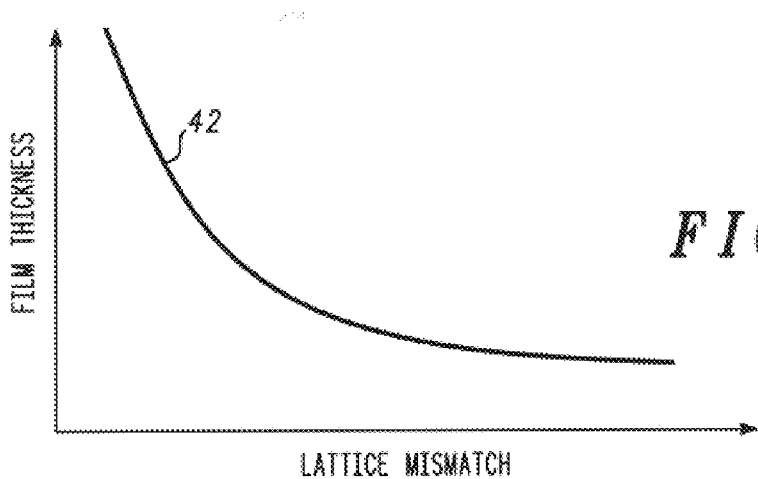
FIG. 4 illustrates graphically the relationship between maximum attainable film thickness and lattice mismatch between a host crystal and a grown crystalline overlayer.

FIG. 4 illustrates graphically the relationship of the achievable thickness of a grown crystal layer of high crystalline quality as a function of the mismatch between the lattice constants of the host crystal and the grown crystal. Curve 42 illustrates the boundary of high crystalline quality material. The area to the right of curve 42 represents layers that tend to be single crystal consistent with the large number of defects/dislocations. With no lattice mismatch, it is theoretically possible to grow an infinitely thick, high quality epitaxial layer on the host crystal. As the mismatch in lattice constants increases, the thickness of achievable, high quality crystalline layer decreases rapidly. As a reference point, for example, if the lattice constants between the host crystal and the grown layer are mismatched by more than about 2%, monocrystalline epitaxial layers in excess of about 20 nm cannot be achieved.

In accordance with one embodiment of the invention, substrate 22 is a (100) or (111) oriented monocrystalline silicon wafer and accommodating buffer layer 24 is a layer of strontium barium titanate. Substantial matching of lattice constants between these two materials is achieved by rotating the crystal orientation of the titanate material by 45° with respect to the crystal orientation of the silicon substrate wafer. The inclusion in the structure of amorphous interface layer 28, a silicon oxide layer in this example, if it is of sufficient thickness, serves to reduce strain in the titanate monocrystalline layer that might result from any mismatch in the lattice constants of the host silicon wafer and the grown titanate layer. As a result, in accordance with an embodiment of the invention, a high quality, thick, monocrystalline titanate layer is achievable.

Still referring to FIGS. 1–3, layer 26 is a layer of epitaxially grown monocrystalline material and that crystalline material is also characterized by a crystal lattice constant and a crystal orientation. In accordance with one embodiment of the invention, the lattice constant of layer 26 differs from the lattice constant of substrate 22. To achieve high crystalline quality in this epitaxially grown monocrystalline layer, the accommodating buffer layer must be of high crystalline quality. In addition, in order to achieve high crystalline quality in layer 26, substantial matching between the crystal lattice constant of the host crystal, in this case, the monocrystalline accommodating buffer layer, and the grown crystal is desired. With properly selected materials this substantial matching of lattice constants is achieved as a result of rotation of the crystal orientation of the grown crystal with respect to the orientation of the host crystal. If the grown crystal is gallium arsenide, aluminum gallium arsenide, zinc selenide, or zinc sulfur selenide and the accommodating buffer layer is monocrystalline $Sr_xBa_{1-x}TiO_3$, substantial matching of crystal lattice constants of the two materials is achieved, wherein the crystal orientation of the grown layer is rotated by 45° with respect to the orientation of the host monocrystalline oxide. Similarly, if the host material is a strontium or barium zirconate or a strontium or barium hafnate or barium tin oxide and the compound semiconductor layer is indium phosphide or gallium indium arsenide or aluminum indium arsenide, substantial matching of crystal lattice constants can be achieved by rotating the orientation of the grown crystal layer by 45° with respect to the host oxide crystal. In some instances, a crystalline semiconductor buffer layer between the host oxide and the grown compound semiconductor layer can be used to reduce strain in the grown monocrystalline compound semiconductor layer that might result from small differences in lattice constants. Better crystalline quality in the grown monocrystalline compound semiconductor layer can thereby be achieved.

The following example illustrates a process, in accordance with one embodiment of the invention, for fabricating a semiconductor structure such as the structures depicted in FIGS. 1–3. The process starts by providing a monocrystalline semiconductor substrate comprising silicon or germanium. In accordance with a preferred embodiment of the invention, the semiconductor substrate is a silicon wafer having a (100) orientation. The substrate is preferably oriented on axis or, at most, about 0.5° off axis. At least a portion of the semiconductor substrate has a bare surface, although other portions of the substrate, as described below, may encompass other structures. The term "bare" in this context means that the surface in the portion of the substrate has been cleaned to remove any oxides, contaminants, or other foreign material. As is well known, bare silicon is highly reactive and readily forms a native oxide. The term "bare" is intended to encompass such a native oxide. A thin silicon oxide may also be intentionally grown on the semiconductor substrate, although such a grown oxide is not essential to the process in accordance with the invention. In order to epitaxially grow a monocrystalline oxide layer overlying the monocrystalline substrate, the native oxide layer must first be removed to expose the crystalline structure of the underlying substrate. The following process is preferably carried out by molecular beam epitaxy (MBE), although other epitaxial processes may also be used in accordance with the present invention. The native oxide can be removed by first thermally depositing a thin layer of strontium, barium, a combination of strontium and barium, or other alkali earth metals or combinations of alkali earth metals in an MBE apparatus. In the case where strontium is used, the substrate is then heated to a temperature of about 750° C. to cause the strontium to react with the native silicon oxide layer. The strontium serves to reduce the silicon oxide to leave a silicon oxide-free surface. The resultant surface, which exhibits an ordered 2×1 structure, includes strontium, oxygen, and silicon. The ordered 2×1 structure forms a template for the ordered growth of an overlying layer of a monocrystalline oxide. The template provides the necessary chemical and physical properties to nucleate the crystalline growth of an overlying layer.

In accordance with an alternate embodiment of the invention, the native silicon oxide can be converted and the substrate surface can be prepared for the growth of a monocrystalline oxide layer by depositing an alkali earth metal oxide, such as strontium oxide, strontium barium oxide, or barium oxide, onto the substrate surface by MBE at a low temperature and by subsequently heating the structure to a temperature of about 750° C. At this temperature a solid state reaction takes place between the strontium oxide and the native silicon oxide causing the reduction of the native silicon oxide and leaving an ordered 2×1 structure with strontium, oxygen, and silicon remaining on the substrate surface. Again, this forms a template for the subsequent growth of an ordered monocrystalline oxide layer.

Following the removal of the silicon oxide from the surface of the substrate, in accordance with one embodiment of the invention, the substrate is cooled to a temperature in the range of about 200–800° C. and a layer of strontium titanate is grown on the template layer by molecular beam epitaxy. The MBE process is initiated by opening shutters in the MBE apparatus to expose strontium, titanium and oxygen sources. The ratio of strontium and titanium is approximately 1:1. The partial pressure of oxygen is initially set at a minimum value to grow stochiometric strontium titanate at a growth rate of about 0.3–0.5 nm per minute. After initiating growth of the strontium titanate, the partial pressure of oxygen is increased above the initial minimum value. The overpressure of oxygen causes the growth of an amorphous silicon oxide layer at the interface between the underlying substrate and the growing strontium titanate layer. The growth of the silicon oxide layer results from the diffusion of oxygen through the growing strontium titanate layer to the interface where the oxygen reacts with silicon at the surface of the underlying substrate. The strontium titanate grows as an ordered monocrystal with the crystalline orientation rotated by 45° with respect to the ordered 2×1 crystalline structure of the underlying substrate. Strain that otherwise might exist in the strontium titanate layer because of the small mismatch in lattice constant between the silicon substrate and the growing crystal is relieved in the amorphous silicon oxide intermediate layer.

After the strontium titanate layer has been grown to the desired thickness, the monocrystalline strontium titanate is capped by a template layer that is conducive to the subsequent growth of an epitaxial layer of a desired compound semiconductor material.

For the subsequent growth of a layer of gallium arsenide, the MBE growth of the strontium titanate monocrystalline layer can be capped by terminating the growth with 1–2 monolayers of titanium, 1–2 monolayers of titanium-oxygen or with 1–2 monolayers of strontium-oxygen. Following the formation of this capping layer, arsenic is deposited to form a Ti—As bond, a Ti—O—As bond or a Sr—O—As. Any of these form an appropriate template for deposition and formation of a gallium arsenide monocrystalline layer. Following the formation of the template, gallium is subsequently introduced to the reaction with the arsenic and gallium arsenide forms. Alternatively, gallium can be deposited on the capping layer to form a Sr—O—Ga bond, and arsenic is subsequently introduced with the gallium to form the GaAs.

Figure 5:
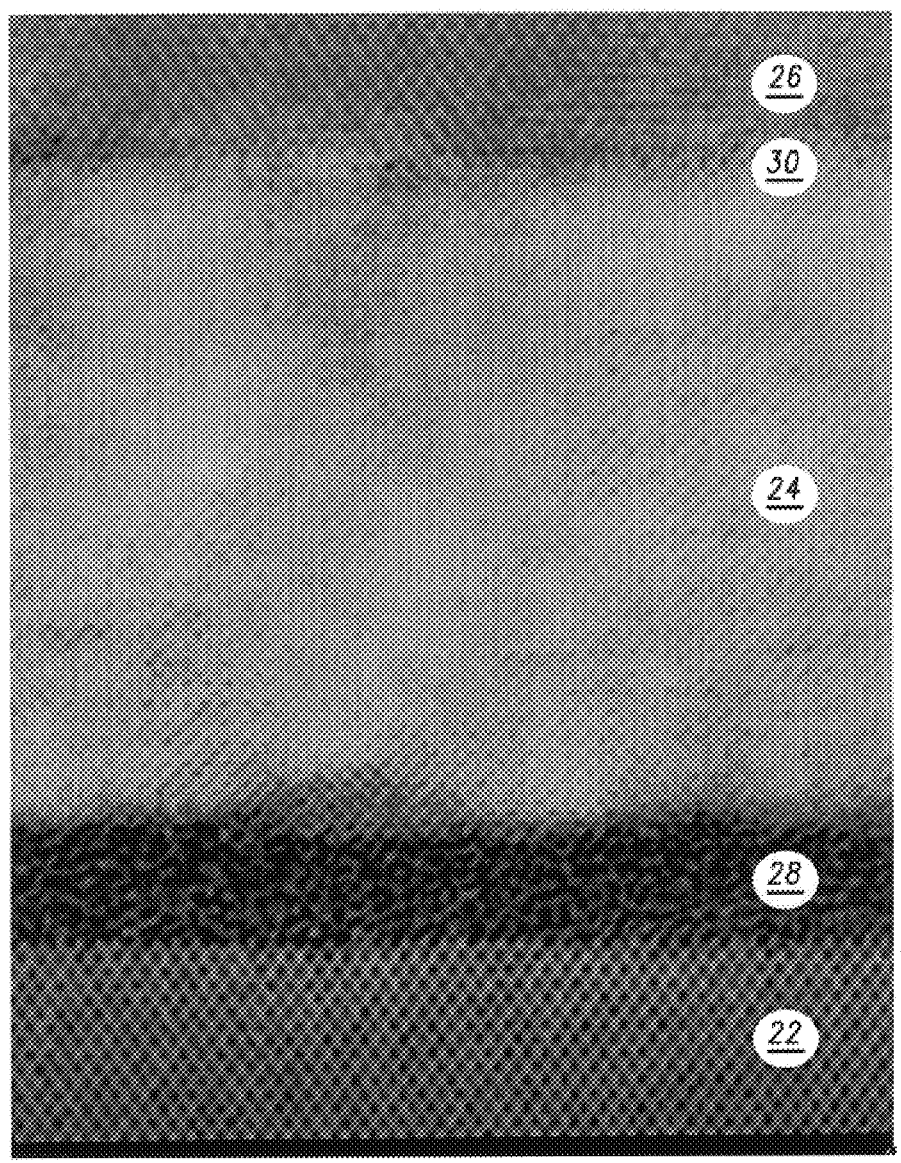
FIG. 5 illustrates a high resolution Transmission Electron Micrograph of a structure including a monocrystalline accommodating buffer layer.

FIG. 5 is a high resolution Transmission Electron Micrograph (TEM) of semiconductor material manufactured in accordance with the present invention. Single crystal $SrTiO_3$ accommodating buffer layer 24 was grown epitaxially on silicon substrate 22. During this growth process, amorphous interfacial layer 28 is formed which relieves strain due to lattice mismatch. GaAs compound semiconductor layer 26 was then grown epitaxially using template layer 30.

Figure 6:
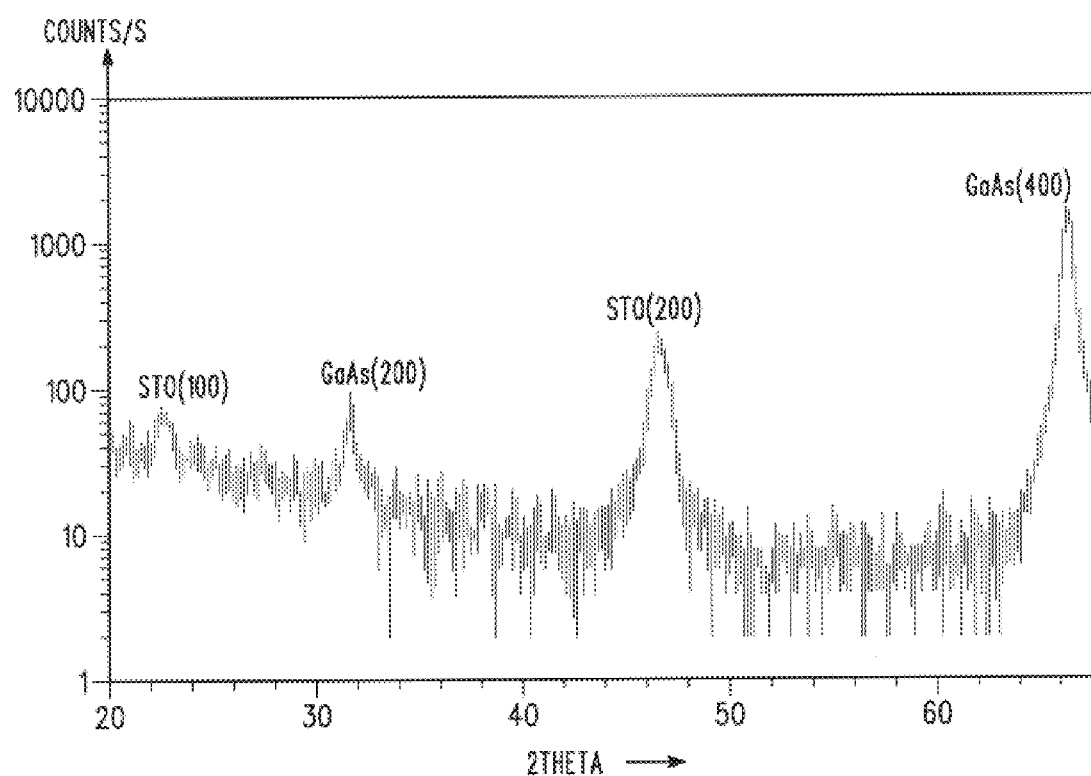
FIG. 6 illustrates an x-ray diffraction spectrum of a structure including a monocrystalline accommodating buffer layer.

FIG. 6 illustrates an x-ray diffraction spectrum taken on structure including GaAs compound semiconductor layer 26 grown on silicon substrate 22 using accommodating buffer layer 24. The peaks in the spectrum indicate that both the accommodating buffer layer 24 and GaAs compound semiconductor layer 26 are single crystal and (100) orientated.

The structure illustrated in FIG. 2 can be formed by the process discussed above with the addition of an additional buffer layer deposition step. The buffer layer is formed overlying the template layer before the deposition of the monocrystalline compound semiconductor layer. If the buffer layer is a compound semiconductor superlattice, such a superlattice can be deposited, by MBE for example, on the template described above. If instead the buffer layer is a layer of germanium, the process above is modified to cap the strontium titanate monocrystalline layer with a final layer of either strontium or titanium and then by depositing germanium to react with the strontium or titanium. The germanium buffer layer can then be deposited directly on this template.

Structure 34, illustrated in FIG. 3, may be formed by growing an accommodating buffer layer, forming an amorphous oxide layer over substrate 22, and growing semiconductor layer 38 over the accommodating buffer layer, as described above. The accommodating buffer layer and the amorphous oxide layer are then exposed to an anneal process sufficient to change the crystalline structure of the accommodating buffer layer from monocrystalline to amorphous, thereby forming an amorphous layer such that the combination of the amorphous oxide layer and the now amorphous accommodating buffer layer form a single amorphous oxide layer 36. Layer 26 is then subsequently grown over layer 38. Alternatively, the anneal process may be carried out subsequent to growth of layer 26.

In accordance with one aspect of this embodiment, layer 36 is formed by exposing substrate 22, the accommodating buffer layer, the amorphous oxide layer, and semiconductor layer 38 to a rapid thermal anneal process with a peak temperature of about 700° C. to about 1000° C. and a process time of about 10 seconds to about 10 minutes. However, other suitable anneal processes may be employed to convert the accommodating buffer layer to an amorphous layer in accordance with the present invention. For example, laser annealing or "conventional" thermal annealing processes (in the proper environment) may be used to form layer 36. When conventional thermal annealing is employed to form layer 36, an overpressure of one or more constituents of layer 30 may be required to prevent degradation of layer 38 during the anneal process. For example, when layer 38 includes GaAs, the anneal environment preferably includes an overpressure of arsenic to mitigate degradation of layer 38.

As noted above, layer 38 of structure 34 may include any materials suitable for either of layers 32 or 26. Accordingly, any deposition or growth methods described in connection with either layer 32 or 26, may be employed to deposit layer 38.

Figure 7:
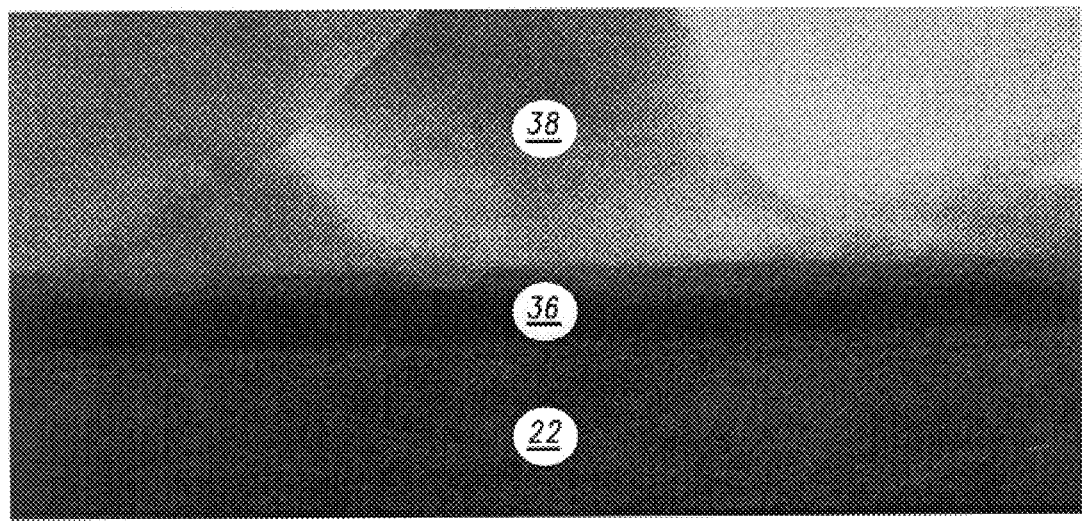
FIG. 7 illustrates a high resolution Transmission Electron Micrograph of a structure including an amorphous oxide layer.

FIG. 7 is a high resolution Transmission Electron Micrograph (TEM) of semiconductor material manufactured in accordance with the embodiment of the invention illustrated in FIG. 3. In Accordance with this embodiment, a single crystal $SrTiO_3$ accommodating buffer layer was grown epitaxially on silicon substrate 22. During this growth process, an amorphous interfacial layer forms as described above. Next, GaAs layer 38 is formed above the accommodating buffer layer and the accommodating buffer layer is exposed to an anneal process to form amorphous oxide layer 36.

Figure 8:
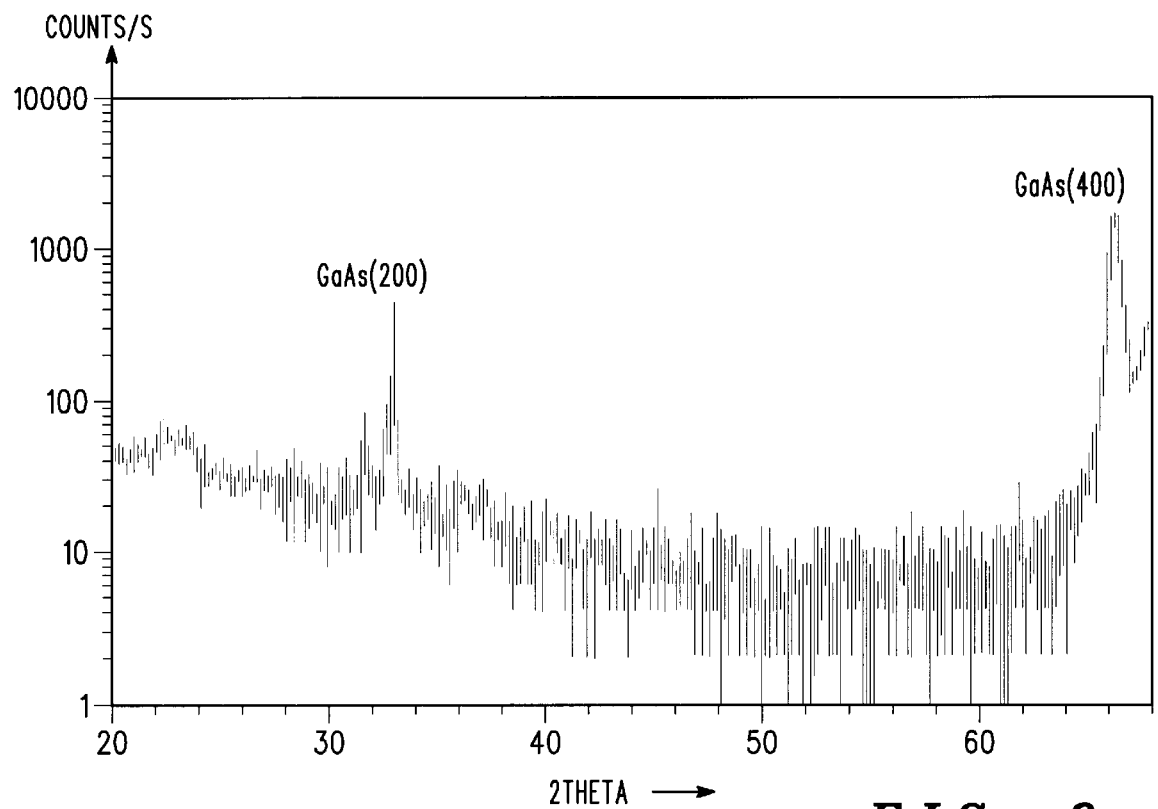
FIG. 8 illustrates an x-ray diffraction spectrum of a structure including an amorphous oxide layer.

FIG. 8 illustrates an x-ray diffraction spectrum taken on a structure including GaAs compound semiconductor layer 38 and amorphous oxide layer 36 formed on silicon substrate 22. The peaks in the spectrum indicate that GaAs compound semiconductor layer 38 is single crystal and (100) orientated and the lack of peaks around 40 to 50 degrees indicates that layer 36 is amorphous.

The process described above illustrates a process for forming a semiconductor structure including a silicon substrate, an overlying oxide layer, and a monocrystalline gallium arsenide compound semiconductor layer by the process of molecular beam epitaxy. The process can also be carried out by the process of chemical vapor deposition (CVD), metal organic chemical vapor deposition (MOCVD), migration enhanced epitaxy (MEE), atomic layer epitaxy (ALE), physical vapor deposition (PVD), chemical solution deposition (CSD), pulsed laser deposition (PLD), or the like. Further, by a similar process, other monocrystalline accommodating buffer layers such as alkaline earth metal titanates, zirconates, hafnates, tantalates, vanadates, ruthenates, and niobates, peroskite oxides such as alkaline earth metal tin-based perovskites, lanthanum aluminate, lanthanum scandium oxide, and gadolinium oxide can also be grown. Further, by a similar process such as MBE, other III–V and II–VI monocrystalline compound semiconductor layers can be deposited overlying the monocrystalline oxide accommodating buffer layer.

Each of the variations of compound semiconductor materials and monocrystalline oxide accommodating buffer layer uses an appropriate template for initiating the growth of the compound semiconductor layer. For example, if the accommodating buffer layer is an alkaline earth metal zirconate, the oxide can be capped by a thin layer of zirconium. The deposition of zirconium can be followed by the deposition of arsenic or phosphorus to react with the zirconium as a precursor to depositing indium gallium arsenide, indium aluminum arsenide, or indium phosphide respectively. Similarly, if the monocrystalline oxide accommodating buffer layer is an alkaline earth metal hafnate, the oxide layer can be capped by a thin layer of hafnium. The deposition of hafnium is followed by the deposition of arsenic or phosphorous to react with the hafnium as a precursor to the growth of an indium gallium arsenide, indium aluminum arsenide, or indium phosphide layer, respectively. In a similar manner, strontium titanate can be capped with a layer of strontium or strontium and oxygen and barium titanate can be capped with a layer of barium or barium and oxygen. Each of these depositions can be followed by the deposition of arsenic or phosphorus to react with the capping material to form a template for the deposition of a compound semiconductor material layer comprising indium gallium arsenide, indium aluminum arsenide, or indium phosphide.

Figure 9:
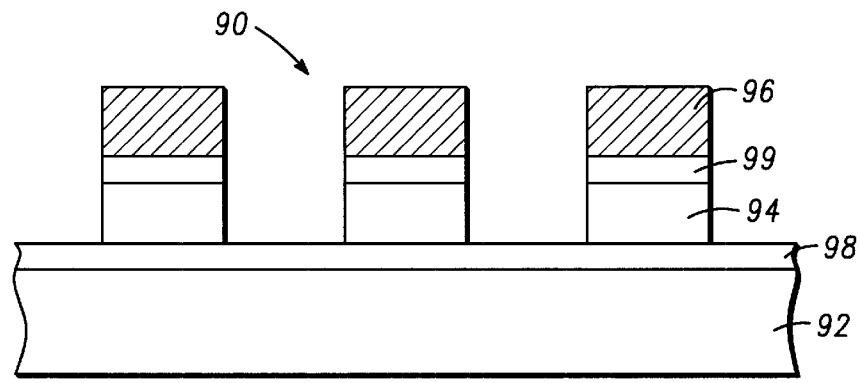

FIG. 9 illustrates schematically, in cross section, a portion of a semiconductor structure 90 in accordance with another embodiment of the invention. Semiconductor structure 90 includes a monocrystalline substrate 92, an accommodating buffer layer 94 comprising a monocrystalline material, and a layer 96 of a monocrystalline compound semiconductor material. The term monocrystalline shall have the same meaning as that used in previously describing the monocrystalline layers with reference to FIG. 1.

In accordance with one aspect of the invention, structure 90 may also include an amorphous intermediate layer 98 positioned between substrate 92 and accommodating buffer layer 94. Like amorphous intermediate layer 28 in FIGS. 1 and 2, amorphous intermediate layer 98 helps to relieve the strain in the accommodating buffer layer and by doing so, aids in the growth of a high crystalline accommodating buffer layer. Further, in accordance with another aspect of the invention, structure 90 may also include a template layer 99 between accommodating buffer layer 94 and compound semiconductor layer 96. As previously explained with reference to template layer 30 in FIGS. 1–3, template layer 99 helps to initiate the growth of compound semiconductor layer 96 on accommodating buffer layer 94.

Like substrate 22 described with reference to FIGS. 1–3, substrate 92 is preferably a large diameter monocrystalline semiconductor wafer composed of material from Group IV of the periodic table and preferably material from group IVA, particularly silicon. Accommodating buffer layer 94 may comprise a monocrystalline oxide or nitride but is preferably a monocrystalline oxide material that is epitaxially grown on substrate 92. As previously explained with reference to layer 28 in FIGS. 1–2, amorphous intermediate layer 98 is grown on substrate 92 at the interface between substrate 92 and growing accommodating buffer layer 94 by the oxidation of substrate 92 during the growth of buffer layer 94. Amorphous intermediate layer 98 relieves strain that might otherwise occur in the monocrystalline accommodating buffer layer 94 as a result of differences in the lattice constants of substrate 92 and buffer layer 94.

Accommodating buffer layer 94 may be comprised of those materials comprising accommodating buffer layer 24 which is described with reference to FIGS. 1 and 2 but is preferably comprised of a monocrystalline oxide material such as metal oxides including alkaline earth metal titanates, alkaline earth metal zirconates, alkaline earth metal hafnates, alkaline earth metal tantalates, alkaline earth metal ruthenates, alkaline earth metal niobates, alkaline earth metal vanadates, perovskite oxides such as alkaline earth metal tin-based perovskites, lamthanum alunminate, lanthanum scandium oxide, and gadolinium oxide.

Monocrystalline oxide layer 94 is grown epitaxially on underlying substrate 92 by any one of a number of conventional deposition techniques and their variants including, but not limited to, molecular beam epitaxy (MBE), metal organic chemical vapor deposition (MOCVD), migration enhances epitaxy (MEE), chemical vapor deposition (CVD), physical vapor deposition (PVD), pulsed laser deposition (PLD), chemical solution deposition (CSD) and atomic layer deposition (ALD). Oxide layer 94 is then photolithographically patterned using conventional semiconductor patterning techniques well known in the industry. The unmasked areas are etched back and will form "voids" between the oxide mesas. In one embodiment, oxide layer 94 is first formed to a predetermined thickness. The oxide layer is then patterned and etched using, for example, photoetchant/ultraviolet (UV) activated light, to remove portions of unwanted oxide layer 94 over substrate 92. The oxide layer can be completely removed to expose bare silicon between oxide mesas as shown in FIG. 9, or in an alternative embodiment, oxide layer 94 is only partially removed to leave a thin layer of oxide between oxide mesas as later shown in FIGS. 12 and 13. In either removal embodiment, the remaining oxide buffer layer has a thickness less than the predetermined thickness of the original oxide layer. The distance between the oxide mesas and the width of the oxide mesas are generally within a range of about 0.1 to 50 micrometers. In yet another embodiment, the non-selected portions of substrate 92 have an oxide layer that is untouched.

Material for compound semiconductor layer 96 can be selected as needed for a particular semiconductor structure but, like layer 26 described with reference to FIGS. 1–3, preferably includes material from any of the Group IIIA and VA elements (III–V semiconductor compounds), mixed III–V compounds, Group II(A or B) and VIA elements (II–VI semiconductor compounds), and mixed II–VI compounds. Examples include gallium arsenide (GaAs), aluminum gallium arsenide (AlGaAs), indium phosphide (InP), indium gallium arsenide (InGaAs), indium gallium phosphide (InGaP), zinc selenide (ZnSe) and zinc sulfur selenide (ZnSSe), and the like.

Compound semiconductor layer 96 is preferably epitaxially grown on oxide buffer layer 94 by any one of a number of conventional deposition techniques. In some growth techniques, such as MOCVD, chemical beam epitaxy (CBE), and metal organic molecular beam epitaxy (MOMBE), an organometallic precursor is used for the growth of Group III elements and a gaseous source is used for the Group V elements. Suitable materials for template layer 99 chemically bond to the surface of accommodating buffer layer 94 at selected sites and provide sites for the nucleation of the epitaxial growth of the subsequent compound semiconductor layer 96. Appropriate materials for template 99 are described in examples previously set out above with reference to template layer 30.

Amorphous intermediate layer 98 is preferably an oxide formed by the oxidation of the surface of substrate 92, and more preferably is composed of a silicon oxide. Amorphous intermediate layer 98 may be formed by increasing the partial pressure of oxygen while epitaxially growing the monocrystalline oxide layer 94 to a partial pressure greater than that needed to grow the monocrystalline oxide layer 94. The thickness of amorphous intermediate layer 98 is sufficient to relieve strain attributed to mismatches between lattice constants of substrate 92 and mononcrystalline oxide layer 94. Typically, amorphous intermediate layer 98 has a thickness in the range of approximately 0.5–5 nm, but if using the oxide layer as a gate dielectric, the amorphous intermediate layer has a thickness in the range of about 5–7 angstroms.

Figure 10:
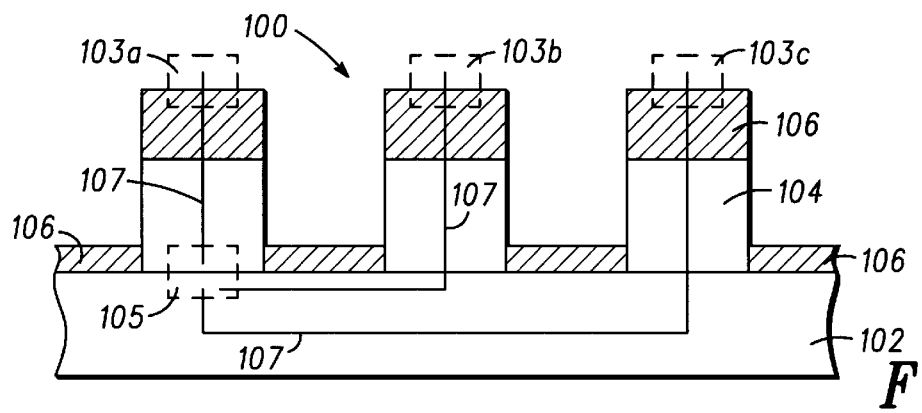

FIG. 10 illustrates, in cross section, a portion of semiconductor structure 100 in accordance with a further embodiment of the invention. Structure 100 is similar to the previously described semiconductor structure 90, except that structure 100 lacks template 99 and amorphous intermediate layer 98, and semiconductor layer 106 and substrate 102 have semiconductor devices 103a, 103b, 103c and 105 formed therein. The present invention allows for the integration of silicon devices and compound semiconductor-based devices on the same substrate. Devices 103a, 103b, 103c and 105 are formed within, or at least partially within, compound semiconductor layer 106 or substrate layer 102. Devices 103a, 103b and 103c are each formed partially within compound semiconductor layer 106 overlying a plurality of oxide mesas which are formed from oxide layer 104.

Figure 11:
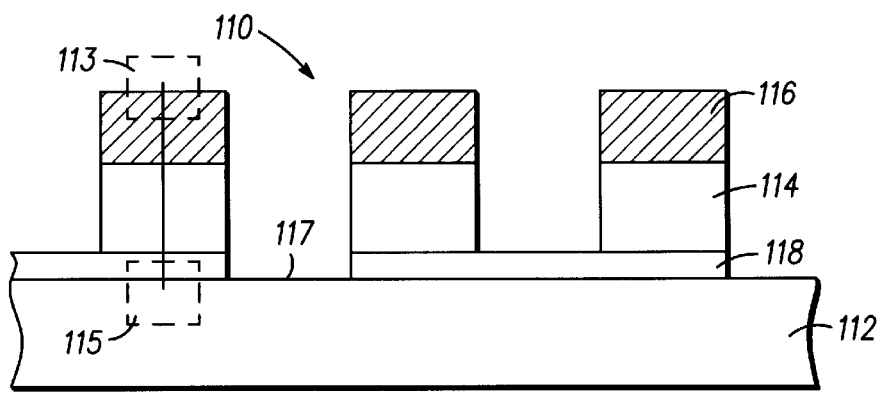
Figure 12:
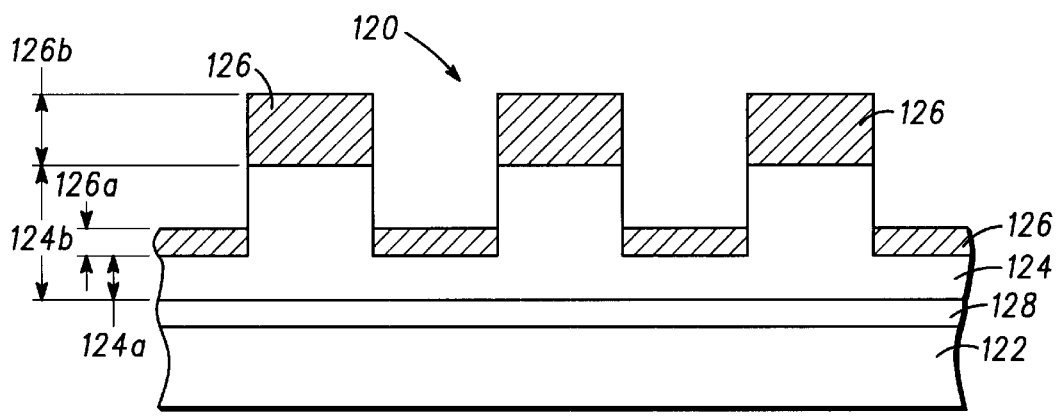
Figure 13:
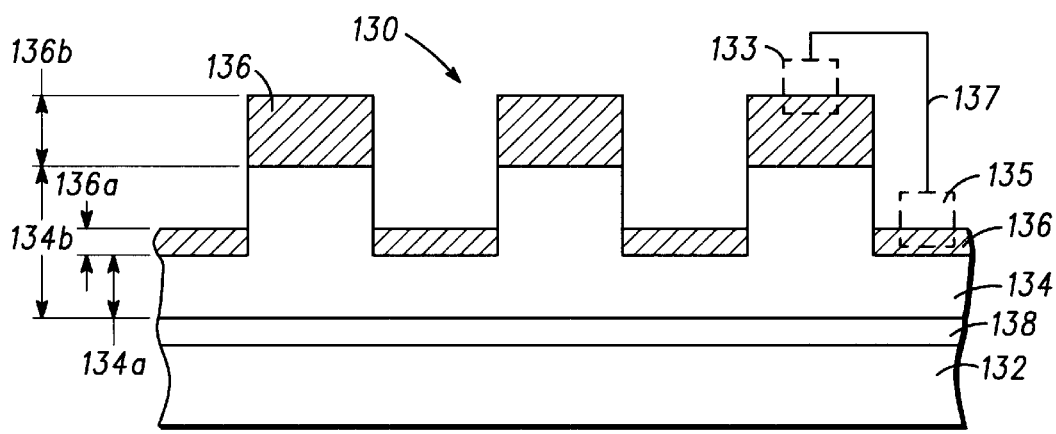

Each mesa containing compound semiconductor layer 106 may range in size from about 0.1 to 50 microns in width and 5 nm to 1 micron in height. It will be appreciated by those skilled in the art that each application will govern the appropriate mesa dimensions. In addition, each application will also govern the width between the mesas. It should also be appreciated that each of the voids may include an oxide layer (as shown in FIGS. 12–14), or alternatively, oxide layer 104 may be removed completely from the void to expose substrate 102 (as shown in FIGS. 10 and 11). Compound semiconductor layer 106 may then be deposited over the exposed substrate as shown in FIG. 10.

Devices 103a, 103b, 103c and 105 are schematically illustrated by dashed lines and may comprise any number of device components such as resistors, capacitors, diodes, and transistors, and may in addition comprise an integrated circuit or radio frequency circuit or circuit component. For example, a MOS device channel may be formed in substrate 102 and the oxide island or mesa overlying the MOS device channel may comprise a gate dielectric. In this type of example, the gate dielectric would have a thickness preferably in the range of about 0.5 nm to about 20 nm. Moreover, as shown in FIG. 10, where a MOS circuit is formed at least partially in substrate 102, semiconductor devices 103a, 103b,and 103c may be formed in each of the monocrystalline compound semiconductor islands, respectively, which are each formed from compound semiconductor layer 106.

Semiconductor devices 103a, 103b and 103c may comprise active or passive components and may include lasers, light emitting diodes, photodetectors, heterojunction bipolar transistors or other components that utilize and take advantage of the physical properties of compound semiconductor materials. Metallic conductors indicated by lines 107 can be formed to electrically couple devices 103a, 103b and 103c to device 105 thereby implementing an integrated device that includes at least one component formed in the silicon substrate and a plurality of components formed in the monocrystalline compound semiconductor material layer.

A cross section of a portion of a semiconductor structure 110 in accordance with another exemplary embodiment of the invention is shown schematically in FIG. 11. Structure 110 includes a monocrystalline semiconductor substrate 112, such as a monocrystalline silicon wafer, a monocrystalline accommodating buffer layer 114 such as a monocrystalline oxide layer as previously discussed with reference to layer 24 in FIGS. 1 and 2 which is epitaxially grown over substrate 112, an amorphous intermediate layer 118 on substrate 112 at the interface between substrate 112 and growing accommodating buffer layer 114 which is grown by the oxidation of substrate 112 during the growth of buffer layer 114, and a monocrystalline compound semiconductor layer 116 which is grown epitaxially over buffer layer 114 after patterning and etching buffer layer 114.

In another aspect of the invention, accommodating buffer layer 114 may be exposed to an anneal process to convert the monocrystalline accommodating buffer layer 114 to an amorphous layer such as layer 36 previously described with reference to FIG. 3. This amorphous layer would comprise materials from both buffer layer 114 and intermediate layer 118, which amorphous layers may or may not amalgamate. With this aspect of the invention, an additional monocrystalline semiconductor layer would be formed by epitaxial growth over buffer layer 114 before annealing buffer layer 114.

Accordingly, when an amorphous layer such as layer 36 in FIG. 3 is formed between substrate 112 and the additional monocrystalline semiconductor layer (See layer 38 in FIG. 3), stress is relieved between the substrate layer and additional semiconductor layer and a true compliant substrate is provided for subsequent processing such as the formation of compound semiconductor layer 116.

The additional semiconductor layer such as layer 38 in FIG. 3 may be comprised of any of the materials described with reference to compound semiconductor material layer 116 and may serve as an anneal cap during the formation of an amorphous layer such as layer 36 in FIG. 3 and as a template for subsequent compound semiconductor layer 116 formation. As with compound semiconductor layer 116, additional semiconductor layer 38 (see FIG. 3) should be thick enough to form devices therein in the event that structure 110 does not include compound semiconductor layer 116.

FIG. 11 shows structure 110 with amorphous intermediate layer 118, monocrystalline buffer layer 114, and compound semiconductor layer 116, and devices 113 and 115 formed in compound semiconductor layer 116 and substrate 112, respectively. Buffer layer 114 and intermediate layer 118 are patterned to expose substrate 112 in at least one area 117 between mesas.

Turning now to FIG. 12, a cross section of a portion of semiconductor structure 120 in accordance with another embodiment of the present invention is illustrated. Structure 120 includes substrate 122, buffer layer 124, intermediate layer 128, and compound semiconductor layer 126. Substrate 122 is preferably a silicon wafer and compound semiconductor substrate 126 may be composed of any of the previously described materials with reference to layer 26 in FIGS. 1–3 and layer 96 in FIG. 9. Buffer layer 124 is preferably comprised of any material previously described with reference to layer 94 in FIG. 9 and intermediate layer 128 is preferably comprised of materials previously described with reference to layer 98 in FIG. 9.

Structure 120 shows an embodiment where buffer layer 124 is not removed from all of the unmasked areas thereby resulting in a thin buffer layer 124 between oxide mesas. During processing, buffer layer 124 is photolithigraphically patterned and partially etched to leave a shelf of monocrystalline buffer layer 124 between a plurality of oxide mesas having a thickness less than the predetermined thickness for buffer layer 124. The different thickness' of buffer layer 124 may be referred to as a first thickness 124a located between oxide mesas and a second thickness 124b greater than the first thickness which includes the first thickness 124a and a thickness of oxide which extends above the first thickness to produce an oxide mesa. As previously discussed, buffer layer 124 preferably comprises a monocrystalline oxide layer.

Compound semiconductor material layer 126 is then epitaxially grown on buffer layer 124 which has been patterned such that that no substrate surface 122 is exposed. This embodiment results in compound semiconductor layers of varying thickness present on the silicon wafer after chemical mechanical polishing. In FIG. 12, these thicknesses are referred to as a third thickness 126a overlying first thickness 124a of buffer layer 124 and fourth thickness 126b overlying second thickness 124b of buffer layer 124. As shown in FIG. 10, fourth thickness 126b of compound semiconductor layer 126 is greater than third thickness 126a of compound semiconductor layer 126. These compound semiconductor layers 126a and 126b of varying thickness can then be used to form a number of different devices. Also, the critical thickness of the epitaxial compound semiconductor layer is increased by relieving strain at the edges of the mesas.

Second thickness 124b of buffer layer 124 has a thickness of about 2 nm to 100 nm, and preferably about 10 nm while first thickness 124a of buffer layer 124 is less in thickness than second thickness 124b due to the etching back of this layer. Fourth thickness 126b of compound semiconductor material layer 126 has a thickness of about 1 nm to about 100 micrometers, and preferably a thickness of about 0.5 micrometers to 10 micrometers. Third thickness 126a of compound semiconductor material layer 126 is less in thickness than fourth thickness 126b also due to the etching back of this layer.

One advantage of growing compound semiconductor layers on patterned wafers is the enhanced quality of the semiconductor compound material which leads to improved performance in both electronic and optical devices by minimizing the number of defects/dislocations in active areas of the compound semiconductor. Further, the compound semiconductor material grown on the silicon substrate surface or the thin oxide (buffer) layer can be removed for the fabrication of silicon based CMOS devices or other devices that make use of the integration of compound semiconductor and silicon devices on a single chip.

FIG. 13 illustrates, in cross section, a portion of a semiconductor structure 130 in accordance with a further embodiment of the invention. Structure 130 is similar to previously described semiconductor structure 120 with the exception that structure 130 includes device 133 formed within fourth thickness 136b of compound semiconductor layer 136 and device 135 formed within third thickness 136a of compound semiconductor layer 136. A metallic conductor schematically indicated by line 137 can be formed to electrically couple device 133 and device 135, thus implementing an integrated device that includes at least one component formed in the monocrystalline compound semiconductor material layer 136.

As previously described, the thin oxide layer which comprises first thickness 134a of buffer layer 134 may be used as a gate dielectric in, for example, a silicon CMOS application.

It should be understood that method steps and process parameters for forming the layers shown in the structures illustrated in FIGS. 9–13 may comprise those method steps and process parameters previously described with reference to producing the structures shown in FIGS. 1–3, 5 and 7.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required or essential features or elements of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for fabricating a semiconductor device structure comprising:

providing a monocrystalline semiconductor substrate;

epitaxially growing a monocrystalline oxide layer overlying the substrate, the oxide layer having a predetermined thickness and comprising a material selected from the group consisting of lanthanum aluminate, alkaline earth metal titanates, alkaline earth metal zirconates, alkaline earth metal hafnates, alkaline earth metal tantalates, alkaline earth metal ruthenates, and alkaline earth metal niobates;

growing an amorphous layer underlying the monocrystalline oxide layer by increasing the partial pressure of oxygen during the step of epitaxially growing a monocrystalline oxide layer to a partial pressure greater than that needed to grow the monocrystalline oxide layer;

photolithographically patterning and etching the monocrystalline oxide layer to form a plurality of oxide mesas; and epitaxially growing a monocrystalline semiconductor layer overlying each of the oxide mesas.

2. The process of claim 1 wherein the step of photolithographically patterning and etching comprises the step of etching through the monocrystalline oxide layer to expose a portion of the semiconductor substrate.

3. The process of claim 1 wherein the step of photolithographically patterning and etching comprises the step of etching partially through the monocrystalline oxide layer to leave a shelf of monocrystalline oxide having a thickness less than the predetermined thickness between the plurality of oxide mesas.

4. The process of claim 3 further comprising the step of epitaxially growing a monocrystalline semiconductor layer overlying the shelf of monocrystalline oxide.

5. The process of claim 4 further comprising the step of planarizing the monocrystalline semiconductor layer overlying each of the oxide mesas and the monocrystalline semiconductor layer overlying the shelf of monocrystalline oxide.

6. The process of claim 5 wherein the step of planarizing comprises the step of chemical mechanical planarization to form a layer of monocrystalline semiconductor material having a substantially planar surface and having first regions of monocrystalline semiconductor material having a first thickness and second regions of monocrystalline semiconductor material having a second thickness.

7. The process of claim 6 further comprising the step of forming first semiconductor devices in the first regions and forming second semiconductor devices in the second regions.

8. The process of claim 1 wherein the step of epitaxially growing a monocrystalline semiconductor layer comprises the step of growing a layer comprising a material selected from the group consisting of Ge, Si—Ge, III–V compounds, mixed III–V compounds, II–VI compounds, and mixed II–VI compounds.

9. The process of claim 1 wherein the step of epitaxially growing a monocrystalline semiconductor layer comprises the step of growing a layer comprising a material selected from the group consisting of GaAs, AlGaAs, InP, InGaAs, InGaP, ZnSe, and ZnSeS.

10. The process of claim 1 wherein each of the steps of epitaxially growing comprises epitaxially growing by a process selected from the group consisting of MBE, MOCVD, CBE, MOMBE, MEE, CVD, PVD, PLD, CSD and ALE.

11. The process of claim 1 further comprising the step of forming an integrated circuit component at least partially in the semiconductor substrate.

12. The process of claim 11 further comprising the step of forming a semiconductor component at least partially in the monocrystalline semiconductor layer overlying at least one of the plurality of oxide mesas.

13. The process of claim 12 further comprising the step of forming an electrical interconnection electrically coupling the integrated circuit component to the semiconductor component.

14. The process of claim 1 further comprising the step of thermally annealing the monocrystalline oxide layer after the step of epitaxially growing a monocrystalline semiconductor layer to convert the monocrystalline oxide layer to an amorphous oxide layer.

15. A process for fabricating a compound semiconductor device structure comprising the steps of:

providing a monocrystalline substrate comprising silicon;

epitaxially growing a first monocrystalline layer comprising $(Ba,Sr)TiO_3$ overlying the monocrystalline substrate;

during the step of epitaxially growing a first monocrystalline layer, forming an amorphous layer comprising silicon oxide underlying the first monocrystalline layer;

photolithographically patterning and etching the first monocrystalline layer to form a plurality of spaced apart oxide islands;

epitaxially growing a second monocrystalline layer comprising a compound semiconductor material overlying each of the oxide islands;

forming an integrated circuit at least partially in the substrate;

forming a plurality of semiconductor devices at least partially in the second monocrystalline layer, one overlying each of the oxide islands; and electrically coupling the integrated circuit and each of the plurality of semiconductor devices.

16. The process of claim 15 further comprising the step of thermally annealing the first monocrystalline layer after the step of epitaxially growing a second monocrystalline layer to convert the first monocrystalline layer to an additional amorphous layer.

17. The process of claim 15 wherein each of the steps of epitaxially growing comprises epitaxially growing by a process selected from the group consisting of MBE, MOCVD, CBE, MOMBE, MEE, CVD, PVD, PLD, CSD and ALE.

18. The process of claim 15 wherein the step of epitaxially growing a second monocrystalline layer comprises the step of growing a layer comprising a compound semiconductor material selected from GaAs, AlGaAs, ZnSe, and ZnSSe.

* * * * *